(12) United States Patent
Chiriac et al.

(10) Patent No.: US 11,920,868 B2
(45) Date of Patent: Mar. 5, 2024

(54) MICRO-CHANNEL PULSATING HEAT PIPE

(71) Applicant: GLOBAL COOLING TECHNOLOGY GROUP, LLC, Scottsdale, AZ (US)

(72) Inventors: Victor Adrian Chiriac, Phoenix, AZ (US); John Richard Thome, Pully (CH)

(73) Assignee: GLOBAL COOLING TECHNOLOGY GROUP, LLC, Scottsdale, AZ (US)

(*) Notice: Subject to any disclaimer, the term of this patent is extended or adjusted under 35 U.S.C. 154(b) by 0 days.

(21) Appl. No.: 17/777,564

(22) PCT Filed: Dec. 23, 2020

(86) PCT No.: PCT/US2020/066938
§ 371 (c)(1),
(2) Date: May 17, 2022

(87) PCT Pub. No.: WO2021/133970
PCT Pub. Date: Jul. 1, 2021

(65) Prior Publication Data
US 2022/0412664 A1 Dec. 29, 2022

Related U.S. Application Data

(60) Provisional application No. 62/953,435, filed on Dec. 24, 2019.

(51) Int. Cl.
*F28D 15/02* (2006.01)
*F28F 3/02* (2006.01)

(52) U.S. Cl.
CPC ..... *F28D 15/0266* (2013.01); *F28D 15/0233* (2013.01); *F28F 3/02* (2013.01); *F28F 2260/02* (2013.01)

(58) Field of Classification Search
CPC .. F28D 15/0233; F28D 15/0266; F28D 15/02; F28D 15/043; H01L 23/427;
(Continued)

(56) References Cited

U.S. PATENT DOCUMENTS 5,199,165 A 4/1993 Crawford et al.
5,845,702 A 12/1998 Dinh
(Continued)

FOREIGN PATENT DOCUMENTS

CN 102944052 A 2/2013
CN 102691999 B 7/2013
(Continued)

OTHER PUBLICATIONS

Global Cooling Technology Group LLC, Extended European Search Report, Appln No. 20906631.5, dated Nov. 24, 2023 (8 pages).

*Primary Examiner* — Harry E Arant
(74) *Attorney, Agent, or Firm* — Bycer & Marion, PLC; Matthew L. Bycer

(57) ABSTRACT

A micro-channel pulsating heat pipe, preferably closed loop, includes a plate with micro-channels with obstructions along interior walls to increase surface area, add nucleation sites for the working fluid vaporization, and otherwise enhance fluid movement and heat transfer. Various shapes of obstructions are considered on one or more of the bottom wall, the side walls, and top wall of the channel. Plating may fit over or around the plate to enhance strength and heat transfer. Ribbing, of a thermally conductive material, may set on the exterior surface of the plate and/or plating to enhance surface area to encourage heat transfer and arranged to facilitate air movement across exterior surface.

13 Claims, 23 Drawing Sheets

(58) Field of Classification Search
CPC ............... H01L 23/373; H01L 23/3731; H01L 23/3672; H01L 23/3736; H01L 33/648; F28F 3/02; F28F 2260/02
See application file for complete search history.

(56) References Cited

U.S. PATENT DOCUMENTS

| | | | |
|---|---|---|---|
| 6,672,373 | B2 | 1/2004 | Smyrnov |
| 8,252,245 | B2 | 8/2012 | Tonkovich et al. |
| 8,919,426 | B2 | 12/2014 | Hardesty |
| 9,101,890 | B2 | 8/2015 | Tonkovich et al. |
| 9,750,160 | B2 | 8/2017 | Short, Jr. et al. |
| 2009/0101308 | A1 | 4/2009 | Hardesty |
| 2009/0326279 | A1 | 12/2009 | Tonkovich |
| 2010/0091459 | A1 | 4/2010 | Zhang |
| 2015/0220122 | A1 | 8/2015 | Rhee et al. |
| 2017/0135247 | A1 | 5/2017 | Ogata |
| 2018/0158756 | A1 | 6/2018 | Smoot et al. |
| 2018/0299206 | A1 | 10/2018 | Kim et al. |

FOREIGN PATENT DOCUMENTS

| | | | |
|---|---|---|---|
| CN | 203518710 U | * | 4/2014 |
| CN | 104792200 A | | 7/2015 |
| CN | 205090838 U | * | 3/2016 |
| CN | 106440899 A | | 2/2017 |
| EP | 3336471 | | 6/2018 |
| EP | 3336471 A1 | * | 6/2018 |
| JP | H01-263493 A | | 10/1989 |
| JP | HEI-07332881 | | 12/1995 |
| JP | H10238973 A | | 9/1998 |
| JP | 003158267 | | 4/2001 |
| JP | 2008298342 | | 12/2008 |
| JP | 2016214050 A | | 12/2016 |
| JP | 2018112358 A | | 7/2018 |
| JP | 2019066104 A | | 4/2019 |
| KR | 20220132524 A | | 9/2022 |

* cited by examiner

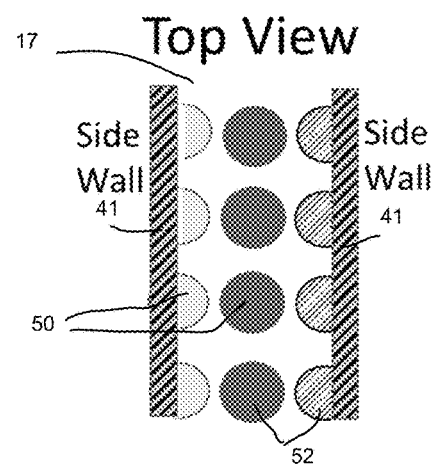
FIG. 18
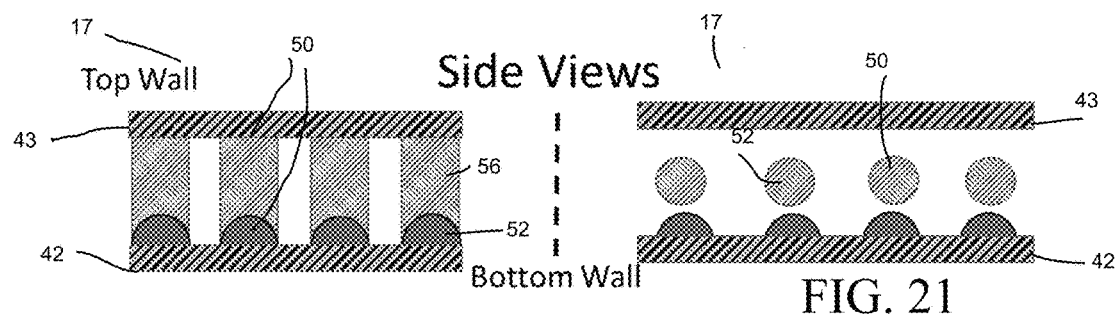
FIG. 19
FIG. 21
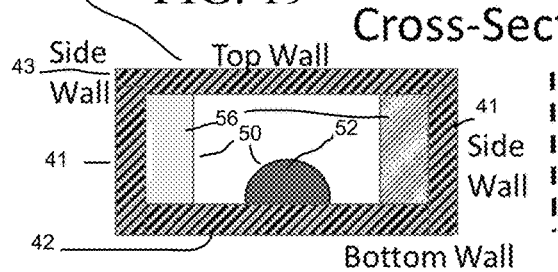
FIG. 20
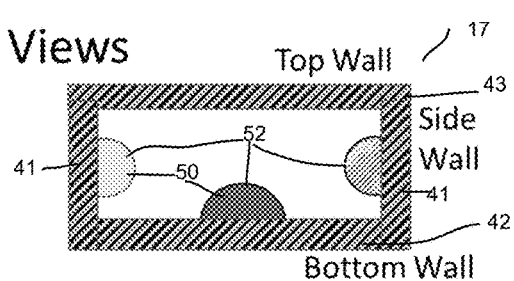
FIG. 22

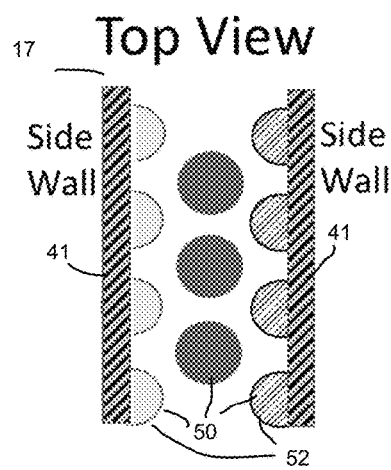
FIG. 28
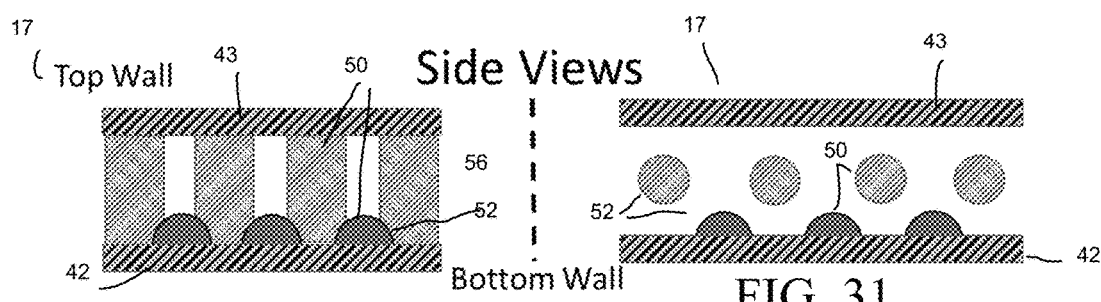
FIG. 29 　　　　　FIG. 31
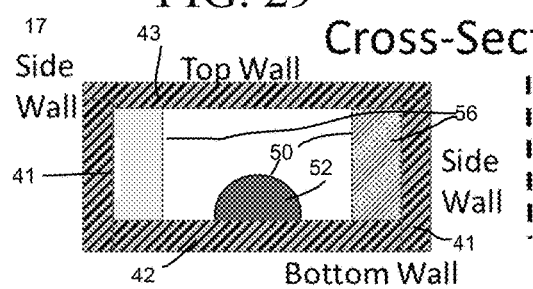　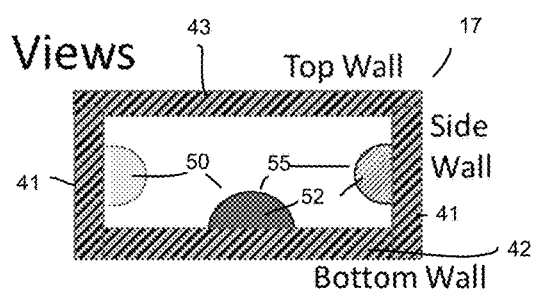
FIG. 30 　　　　　FIG. 32

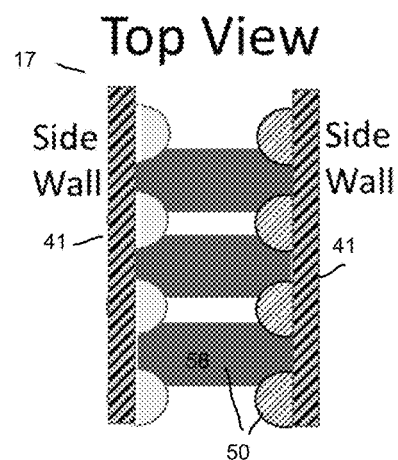
FIG. 33
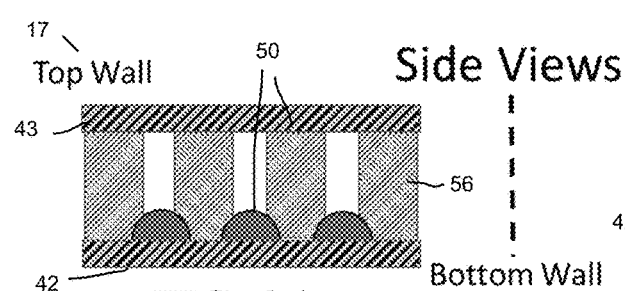
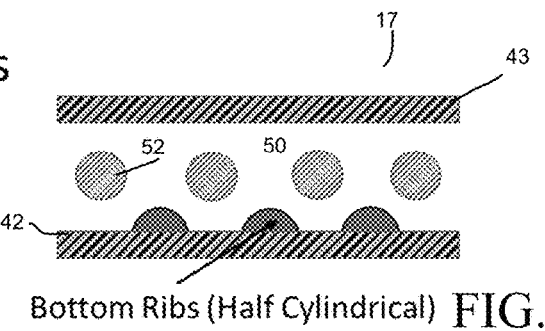
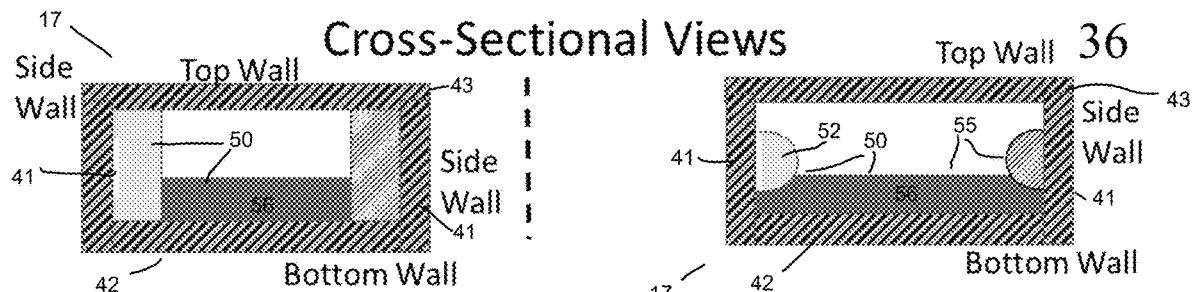
FIG. 35 FIG. 37

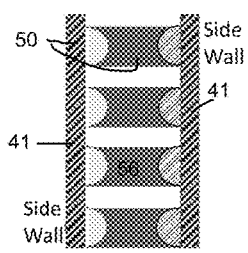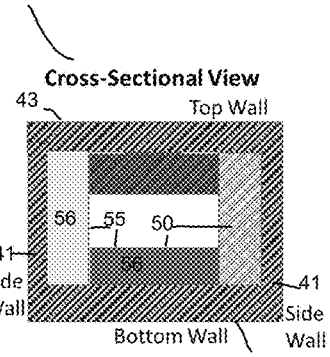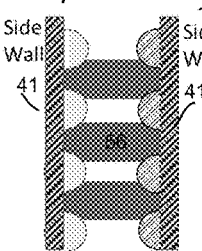
FIG. 38  FIG. 40  FIG. 41
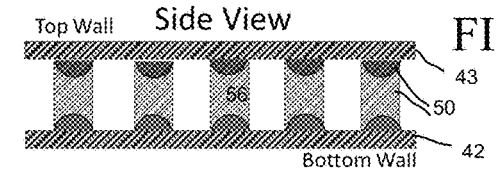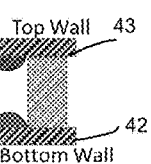
FIG. 39 Figs 38-42  FIG. 42
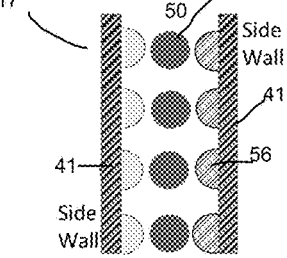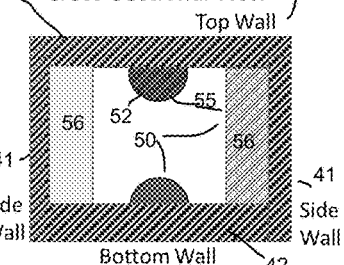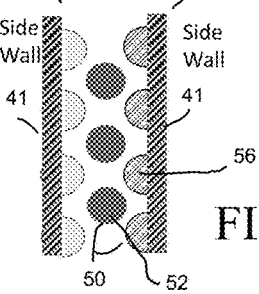
FIG. 43  FIG. 45  FIG. 46
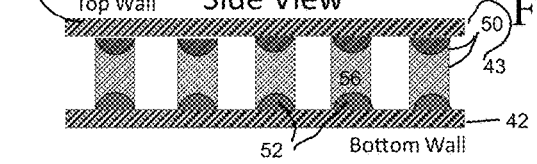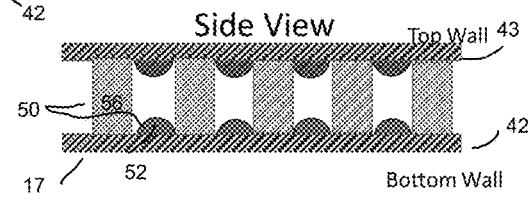
FIG. 44  FIG. 47

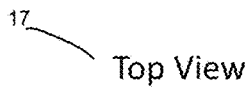
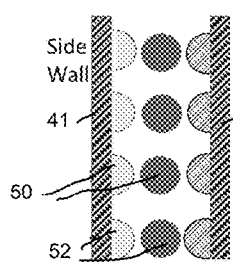
FIG. 56
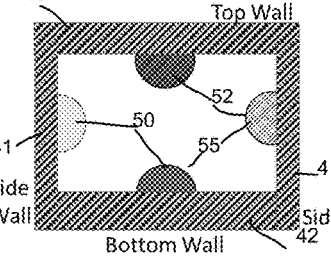
FIG. 58
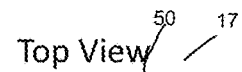
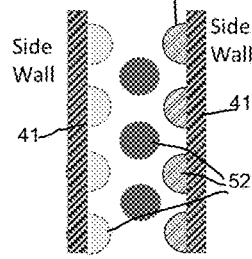
FIG. 59
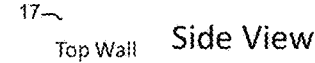
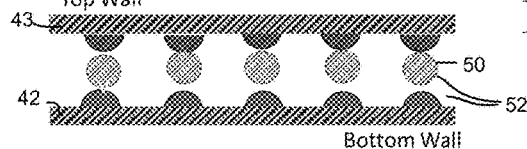
FIG. 57
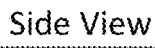
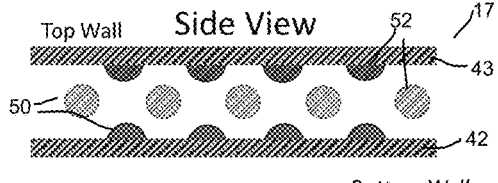
FIG. 60
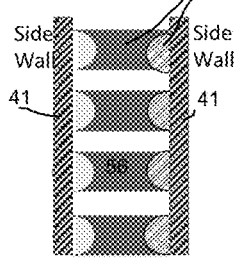
FIG. 61
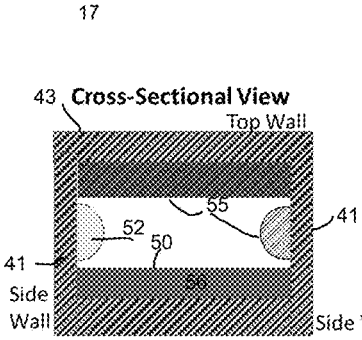
FIG. 63
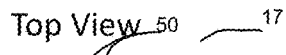
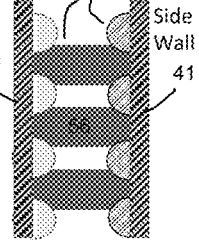
FIG. 64
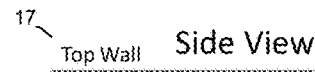
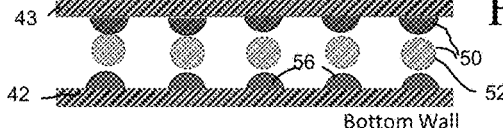
FIG. 62
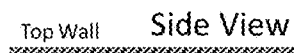
FIG. 65

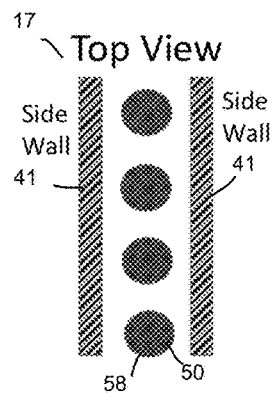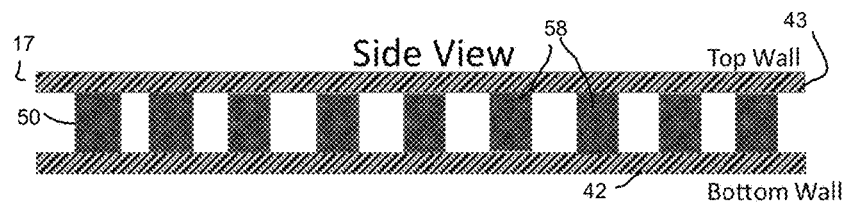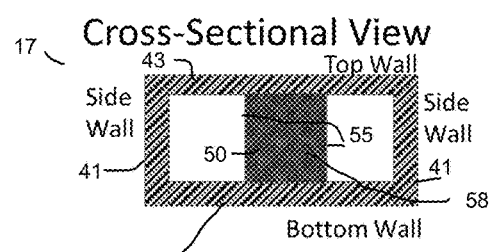
FIG. 72
FIG. 73
FIG. 74
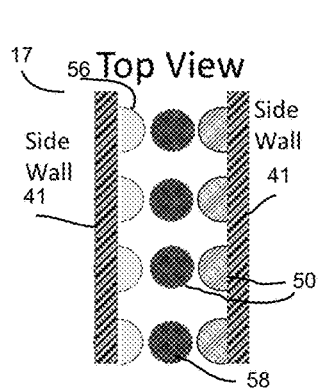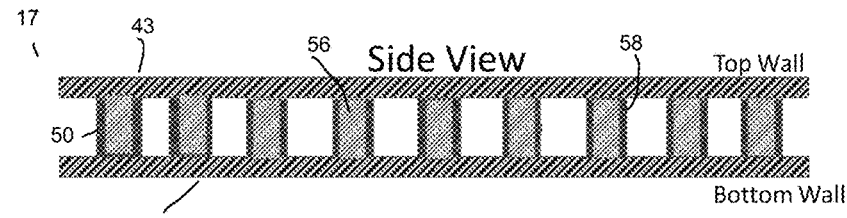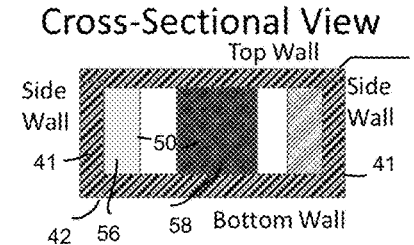
FIG. 75
FIG. 76
FIG. 77

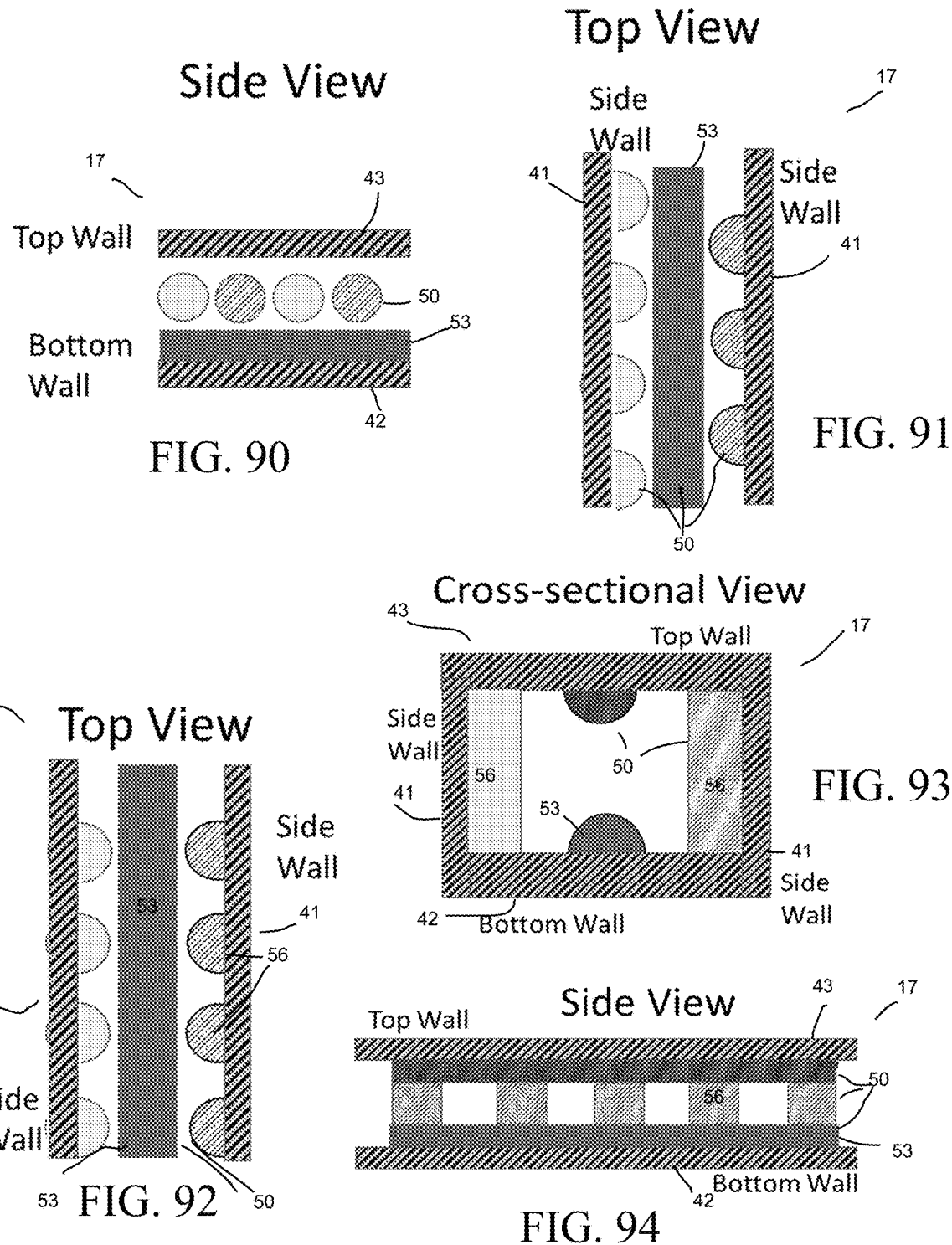

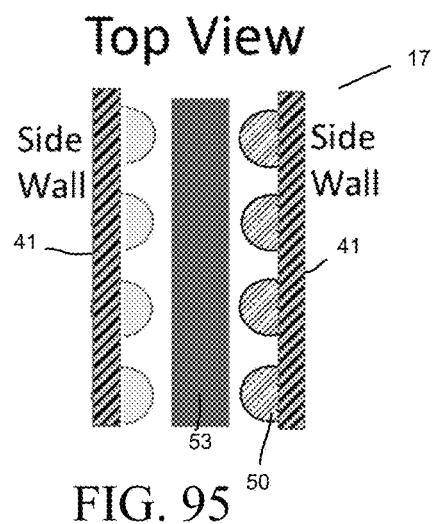
FIG. 95
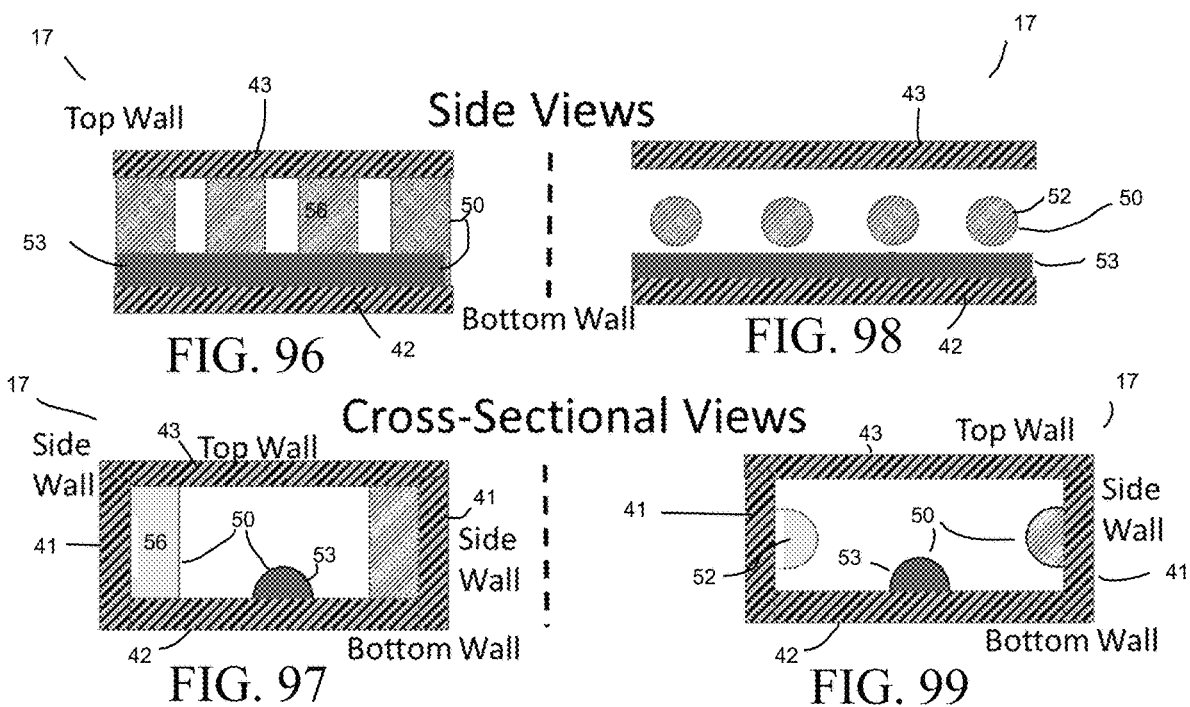
FIG. 96
FIG. 97
FIG. 98
FIG. 99

MICRO-CHANNEL PULSATING HEAT PIPE

CLAIMS OF PRIORITY

The present application includes subject matter disclosed in and claims priority to PCT application entitled "Micro-Channel Pulsating Heat Pipe" filed Dec. 23, 2020 and assigned Serial No. PCT/US20/066938, and provisional application entitled "Pulsating Heat Pipe" filed Dec. 24, 2019 and assigned Ser. No. 62/953,435, both incorporated herein by reference, describing inventions made by the present inventors.

BACKGROUND OF THE INVENTION

1. Field of the Invention

The present invention relates to heat removal and thermal management. The present invention more specifically relates to passive micro-channel pulsating heat pipe devices and related methods.

2. Description of Related Prior Art

Heat removal has become essential for the proper performance of high-density microelectronics, optical devices, instrumentation and other electrical/electronic devices. Thermal control systems allow the instruments, communication systems, power systems and other electronic devices to operate within a specified temperature range. In simplest terms, cooling is provided by conductance of thermal energy away from warm sources into radiators or heat exchangers and then dispersed. This is especially focused in the art of portable electronics due the small and light-weight nature of devices.

Heat is dissipated using heatsinks and thermal diffusion covers formed from one or more of: high thermal conductivity metal, such as aluminum, copper, beryllium oxide, or combinations thereof; annealed pyrolytic graphite (APG) embedded in metal; embedded wick-action heat pipes within metal; or heat pipes in metal. Metals with a thermal conductivity greater than that of aluminum typically give rise to weight, cost, and/or fabrication issues. Wick-action heat pipes often require a minimum diameter that, even with flattening, can exceed the maximum desired plate thickness. Many types of materials can be diffusion bonded including: Copper, Inconel, Stainless Steel, Titanium, Nickel, Silver, and others. When adapting PHPs to electronics, US20180299206 suggested use of a light-weight polymer-based PHP with high flexibility that generated heat transfer properties exceeding solid copper.

A pulsating heat pipe (PHP), as is known in the art, may include micro-channel embedded pulsating heat pipes incorporated into a substrate. When in a planar shape, the substrate takes the form of a plate. The use of embedded micro-channels allows an order of magnitude or more jump in the thermal conductivity of conventional materials like aluminum and copper via integral embedded heat pipes. PHPs utilize both phase change and fluid motion to enhance heat transfer. A volume of working fluid, preferably in a vacuum, is introduced into the micro-channel(s), which will disseminate to become slugs of liquid separated by vapor pockets. Heating of the contents of the micro-channel at an evaporator region (heat source) will induce further vaporization within the micro-channels, whereas cooling at a heat sink will induce further condensation within the micro-channels. Both heating and cooling act to both drive fluid flow, or cause pulsations, within the micro-channel and efficiently transfer heat.

Pulsating heat pipes are passive thermal control devices, employing a heat source evaporation section and a heat sink condensation section of the pipe to affect a two-phase heat pipe. Pulsating heat pipes consist of one or more capillary dimension tubes bent into a curving structure to form parallel or interwoven structures. Heat is applied to the evaporator area/zone of the tubing resulting in increased vapor pressure and disrupting the equilibrium of the system. As the vapor pressure increases, larger vapor bubbles are created and pulse from this high-pressure area. At the other end of the assembly is the condenser zone with condenser. In the condenser zone, heat is removed, by external heat sink or otherwise, and in so doing the vapor is reduced shrinking the bubbles and reducing the pressure.

A closed loop pulsating heat pipe (CLPHP) may be configured as a serpentine channel (CLPHPs are intended to function without a wick). Fluid in a CLPHP creates a highly unstable two-phase flow within the serpentine, going back-and-forth or in one direction with an oscillatory motion between the evaporator and condenser zones. PHPs may work in many orientations, including vertical, inclined, horizontal and inverted orientation, allowing for innovative geometrical layouts. Since the oscillatory motion is not dependent (or very weakly dependent) on gravity, PHPs work in vacuum as well. The pulsating fluid flow motion of elongated bubbles and liquid slugs within the serpentine is due to the complex two-phase flow instability caused by nucleation and growth of vapor bubbles in the evaporator zone and their condensation and collapse in the condenser zone. A well-designed pulsating heat pipe creates a higher "time-averaged" flow rate than a conventional heat pipe or a vapor chamber ("multi-fingered" flattened tube heat pipe) and transfers more latent heat from the evaporator to the condenser whilst the back-and-forth flow inhibits the onset of dryout.

A micro-channel embedded pulsating heat pipe (ME-PHP) simply consists of a micro-channel in a serpentine configuration placed in the middle of a plate. Phase change from liquid to vapor and back, coupled with vapor bubble/liquid slug pulsation through the wickless flow channels between a condenser and evaporator, facilitate thermal transfer and cooling. Flow channels have a diameter (or transversal cross-sectional area) thinner than the plate, and the central path of the flow channels lies substantially within a two-dimensional planar area. A CLPHP is one possible for of ME-PHP.

There are distinct regions to the pulsating heat pipe, including the evaporator zone, condenser zone, and potentially an adiabatic region. When the pulsating heat pipe is at rest, with no heat being introduced and no heat being removed, the system is in equilibrium. The system becomes unbalanced when heat is applied to the evaporator. In turn the heat converts more of the working fluid to vapor and the vapor bubbles become larger within that portion of the pulsating heat pipe. Likewise, at the condenser, heat is being removed from the PHP and the bubbles are reducing in size. The volume expansion due to vaporization and the contraction due to condensation cause an oscillating motion within the channels. The net effect of the temperature gradient between the evaporator and the condenser and the perturbations introduced from the serpentine pattern of the micro-channels is the creation of a non-equilibrium pressure condition. Combine this with the vapor/fluid fill distributed throughout the PHP and you have the self-sustaining driving force for oscillations to provide thereto-fluidic transport. Since these pressure pulsations are fully thermally driven and due to the solid-state construction of the PHP, there is no need for external power or energy beyond the thermal input from a warm source to operate the PHP.

The concept of pulsating heat pipes is well-known in the art. For instance, U.S. Pat. No. 6,672,373 described an improvement in the geometry of the pipes to improve heat transfer in a pulsating heat pipe. For instance, varying the diameter of the pipes was considered a method of providing thermo-hydraulic difference in the heat/mass transfer coefficients to facilitate heat transfer. U.S. Pat. No. 8,919,426 considered the concept of a thin micro channel PHP that could incorporate carried cross-sections, such as rounded and/or rectangular with varied diameters to encourage annular flow along the sidewalls in wider sections allowing for heat transfer via vaporization. CN102691999B further contemplated triangular cross-sections. CN 104792200A added lyophilic coating to the interior walls of PHPs to enhance heat exchange into the walls of the PHP channels.

PHPs have also been considered for larger scale implementations, such as the use in air conditioning units, as shown in CN102944052. When adapting PHPs to handheld electronic devices, the insufficiency of PHP heat transfer power led to U.S. Pat. No. 9,750,160 describing a multi-level oscillating heat pipe in and around an electronic module.

Heat dissipation is a limiting factor for the high-end chips powering the mobile devices. The overheating of various processor/modem chips and packages lead to performance reduction and even failure of these devices. The next generation high power density electronics and communication technologies (5G and beyond) require superior cooling solutions compared to today's existing solutions (Al/Cu heat spreaders and heat sinks, wick driven heat pipes and vapor chambers).

A new two-phase Closed Loop Pulsating Heat Pipe (CL-PHP) technology and geometries are developed/optimized/built to enhance the cooling of high-density electronics and to reduce the energy dissipated by the microprocessors.

At this time, passive PHPs have not yet been widely adopted for heat management with heat sinks or heat transfer mechanisms for electronic devices, nor heavily relied upon for maintaining thermogradient of electronic products. Improvements to the design and functionality of PHPs may foster growth in adoption and applications of same.

It is therefore an object of the present invention to improve the heat transfer capabilities of pulsating heat pipes.

It is another object of the present invention to provide a light-weight portable heat pipe.

It is yet another object of the present invention to provide a pulsating heat pipe system useful with electronics and electronic devices.

SUMMARY OF THE INVENTION

The heat transfer coefficient of a PHP can be improved by facilitating the flow of fluid slugs, vapor pockets, and further encouraging the vaporization of the working fluid within the pipes. To overcome a disadvantage of PHPs wherein slugs are not active except along the edges, we can increase the potential vaporization and break up of slugs with additional nucleation sites. Various geometries of the pipes may be used and improved via inclusion of regular or randomized obstructions within the pipes to facilitate nucleation. Nucleation may occur at sharp boundaries by manipulation of vapor pressure and surface tension. By stretching the slugs containing working fluid in liquid form, a thin liquid layer is subject to more vapor pressure forces, increased surface area, and more likely to vaporize. Nucleation sites may be accomplished by adding structures as obstacles within the channels. The obstacles may be regularly arranged, on one or more sides, and of various shapes. Rather than modifying the shape of the channel exterior, at these micro-channel sizes, it is still possible to introduce obstacles.

Various obstacle geometries and arrangements are included, for instance the use of semispherical attachments to side walls and/or ceiling and bottom wall, semicylindrical attachments, rising cylindrical or rectangular posts traversing the entire channel (preferably through the center), semi-cylindrical attachments crossing the channel, or hemicylindrical posts on each wall and top/bottom, etc.

In addition, the PHP plate may incorporate structures or plating on the exterior. For instance, thin sheet copper film or plating may be used over part or all of the plate. The plating may be provided over the evaporator and/or condenser zones. Similarly, ribbing may be used within the plating to provide additional surface area. Ribbing may be set along longitudinal piping, diagonal or across. The width or ribs may coincide with the width of channels or inter-channel spacing.

BRIEF DESCRIPTION OF THE DRAWINGS

The present invention will be described with greater specificity and clarity with reference to the following drawings, in which:

FIGS. 5A and 5B illustrates magnified views of Sections A and B of FIG. 5.

FIG. 18 illustrates a top cross-sectional view of a PHP channel of an embodiment of the present invention.

FIG. 19 illustrates a side cross-sectional view of a PHP channel of an embodiment of the present invention.

FIG. 20 illustrates a transversal cross-sectional view of a PHP channel of an embodiment of the present invention.

FIG. 21 illustrates a side cross-sectional view of a PHP channel of an embodiment of the present invention.

FIG. 22 illustrates a transversal cross-sectional view of a PHP channel of an embodiment of the present invention.

FIG. 28 illustrates a top cross-sectional view of a PHP channel of an embodiment of the present invention.

FIG. 29 illustrates a side cross-sectional view of a PHP channel of an embodiment of the present invention.

FIG. 30 illustrates a transversal cross-sectional view of a PHP channel of an embodiment of the present invention.

FIG. 31 illustrates a side cross-sectional view of a PHP channel of an embodiment of the present invention.

FIG. 32 illustrates a transversal cross-sectional view of a PHP channel of an embodiment of the present invention.

FIG. 33 illustrates a top cross-sectional view of a PHP channel of an embodiment of the present invention.

FIG. 34 illustrates a side cross-sectional view of a PHP channel of an embodiment of the present invention.

FIG. 35 illustrates a transversal cross-sectional view of a PHP channel of an embodiment of the present invention.

FIG. 36 illustrates a side cross-sectional view of a PHP channel of an embodiment of the present invention.

FIG. 37 illustrates a transversal cross-sectional view of a PHP channel of an embodiment of the present invention.

FIG. 38 illustrates a top cross-sectional view of a PHP channel of an embodiment of the present invention.

FIG. 39 illustrates a side cross-sectional view of a PHP channel of an embodiment of the present invention.

FIG. 40 illustrates a transversal cross-sectional view of a PHP channel of an embodiment of the present invention.

FIG. 41 illustrates a top cross-sectional view of a PHP channel of an embodiment of the present invention.

FIG. 42 illustrates a side cross-sectional view of a PHP channel of an embodiment of the present invention.

FIG. 43 illustrates a top cross-sectional view of a PHP channel of an embodiment of the present invention.

FIG. 44 illustrates a side cross-sectional view of a PHP channel of an embodiment of the present invention.

FIG. 45 illustrates a transversal cross-sectional view of a PHP channel of an embodiment of the present invention.

FIG. 46 illustrates a top cross-sectional view of a PHP channel of an embodiment of the present invention.

FIG. 47 illustrates a side cross-sectional view of a PHP channel of an embodiment of the present invention.

FIG. 56 illustrates a top cross-sectional view of a PHP channel of an embodiment of the present invention.

FIG. 57 illustrates a side cross-sectional view of a PHP channel of an embodiment of the present invention.

FIG. 58 illustrates a transversal cross-sectional view of a PHP channel of an embodiment of the present invention.

FIG. 59 illustrates a top cross-sectional view of a PHP channel of an embodiment of the present invention.

FIG. 60 illustrates a side cross-sectional view of a PHP channel of an embodiment of the present invention.

FIG. 61 illustrates a top cross-sectional view of a PHP channel of an embodiment of the present invention.

FIG. 62 illustrates a side cross-sectional view of a PHP channel of an embodiment of the present invention.

FIG. 63 illustrates a transversal cross-sectional view of a PHP channel of an embodiment of the present invention.

FIG. 64 illustrates a top cross-sectional view of a PHP channel of an embodiment of the present invention.

FIG. 65 illustrates a side cross-sectional view of a PHP channel of an embodiment of the present invention.

FIG. 72 illustrates a top cross-sectional view of a PHP channel of an embodiment of the present invention.

FIG. 73 illustrates a side cross-sectional view of a PHP channel of an embodiment of the present invention.

FIG. 74 illustrates a transversal cross-sectional view of a PHP channel of an embodiment of the present invention.

FIG. 75 illustrates a top cross-sectional view of a PHP channel of an embodiment of the present invention.

FIG. 76 illustrates a side cross-sectional view of a PHP channel of an embodiment of the present invention.

FIG. 77 illustrates a transversal cross-sectional view of a PHP channel of an embodiment of the present invention.

FIG. 90 illustrates a side cross-sectional view of a PHP channel of an embodiment of the present invention.

FIG. 91 illustrates a top cross-sectional view of a PHP channel of an embodiment of the present invention.

FIG. 92 illustrates a top cross-sectional view of a PHP channel of an embodiment of the present invention.

FIG. 93 illustrates a transversal cross-sectional view of a PHP channel of an embodiment of the present invention.

FIG. 94 illustrates a side cross-sectional view of a PHP channel of an embodiment of the present invention.

FIG. 95 illustrates a top cross-sectional view of a PHP channel of an embodiment of the present invention.

FIG. 96 illustrates a side cross-sectional view of a PHP channel of an embodiment of the present invention.

FIG. 97 illustrates a transversal cross-sectional view of a PHP channel of an embodiment of the present invention.

FIG. 98 illustrates a side cross-sectional view of a PHP channel of an embodiment of the present invention.

FIG. 99 illustrates a transversal cross-sectional view of a PHP channel of an embodiment of the present invention.

DETAILED DESCRIPTION OF THE PREFERRED EMBODIMENTS

Figure 1:
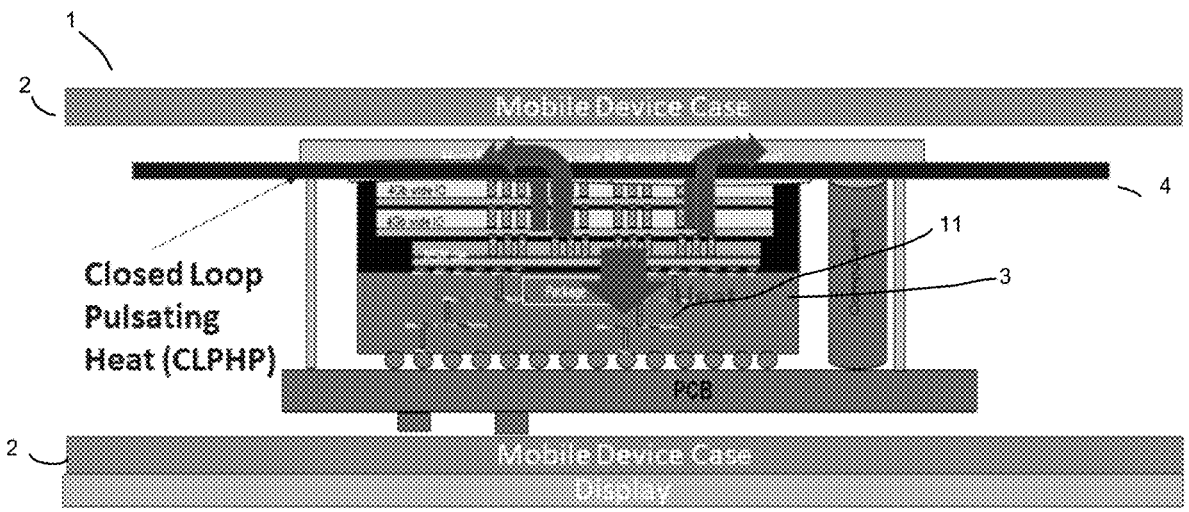
FIG. 1 illustrates a side cross-sectional view of a standard portable electronic device of the prior art.

In the field of electronics cooling, heat sinks and heat energy dissipation devices have been used to draw and expel heat energy from components. Pulsating heat pipes (PHPs) have been devised by others to utilize serpentine paths of alternating bubbles and slugs to move energy from a heat source (evaporator) to a cooling (condensing) area, and otherwise spread and dissipate heat. Serpentine paths have been developed in a number of shapes, orientations, dimensions, in duplication, and so forth. Serpentine paths thus far have utilized simple cross-sections to allow the working fluid to move/alternate through the system. The working fluid is known in the art and is preferably a low global warming potential fluid, preferably functions with low vapor pressure. Conventional cross-sections are circular, hemicylindrical, rectangular, square, etc. Preferably the plate is built form a base sheet (with side walls and bottom wall) with a canal formed by machining, lasering, or otherwise, and a top sheet forming a top wall to complete the plate. Features on the top sheet may conform to the placement and shape of the canal, the top wall formed of the top sheet to form a channel. Preferably, the plate is made of a material known in the art, or as otherwise may be developed. Current technologies suggest ceramics, such as Al—Ni, Al—Cu, Cu, C (e.g. graphite), or otherwise. The size of the plate is preferably set for mobile technologies, such as a tablet, mobile phone, or server. Microchannels are preferably sized with the plate on the order of 500 micros, size 10 microns to 1 mm. For instance, with a phone embodiment, plate may be 400-800 micron tall with 250-500 micron sized channels.

No solution has yet suggested placing obstacles in the path, nor modifying the shape of the path to achieve advanced cooling. The present invention is directed to alternative path cross-sections, including multiple obstacle geometries and arrangements. One or more obstacle may be bound on the left, right side, the top, and/or bottom of the channel to cause the fluid to move around the obstacle. Various path and obstacle corners and engagement points and lines are created in the pathway. Repeating and random patterns may be used in coordinated, parallel, and/or staggered patterns. Columns may be used to traverse the pathway, or longitudinal bulges, or obstacle/s may also be used in isolation or in conjunction with alternative obstacle arrangements. The size of the obstacles may be modified to provide proper balance between heat flux and forcing engagement of fluid with surfaces, in order to reduce flow resistance and enhance the heat transfer. The obstacles add surface area within channel and may create additional nucleation sites to enhance heat transfer as between the working fluid and the plate.

The system introduces the idea of an obstacle, multiple obstacles, or otherwise, a non-standard throughway for pulsating heat pump serpentine paths. The system may be scaled for a variety of embodiments, ranging from portable electronic devices (mobile phones, tablets, or laptops on the order of 180×80 mm) to small devices and components, as well as larger systems such as server blades, data centers, etc. on the order of 1 m×0.5 m. Serpentine, or straight forward pathways may be modified with the current system. The channels may be of any size, and a preferred embodiment includes a 200 micron-1 mm high channel and a 200 micron to 700-micron wide channel. When used on portable electronics, it is contemplated that the plate holding the PHP may be the size of the Printed Circuit Board, or more preferably, a large portion of one side of the mobile device internal casing, as is known in the art for other heat sinks and dissipation technologies.

For exemplary purposes, PHP device thickness may range from 0.3 mm to 2 mm in a mobile application. The microchannels may range from 0.2 mm to 1.5 mm in height, in this case for mobile devices. For larger scale applications, such as data centers, base stations, etc., the device thickness may range from 1.5 mm to 5 cm.

The heat transfer coefficient of a PHP can be improved by facilitating the flow of fluid slugs, vapor pockets, and further encouraging the vaporization of the working fluid within the pipes. To overcome a disadvantage of PHPs wherein slugs are not active except along the edges, we can increase the potential vaporization and break up of slugs with additional nucleation sights. Rather than modifying the shape of the channel exterior, at these micro-channel sizes, it is still possible to introduce obstacles.

With use of embodiments of the present invention, one may design a PHP with the evaporator located at the PHP center while multiple condensers are placed at the extremes, and/or the evaporator is placed at the PHP end while the condenser is placed at the opposite end. An adiabatic zone may be set between a condenser zone and an evaporator zone.

A new two-phase closed loop pulsating heat pipe (CL-PHP) introduces disruptive designs to enhance the cooling of high-power dissipation electronics and save the energy dissipated by the microprocessors by more than 40-50% compared to today's advanced cooling solutions (wick driven heat pipes and vapor chambers) for mobile computing and power microelectronics. The flow instability created in the customized CLPHP system with disruptive nucleation sites in the evaporator (dimples, bars, pillars and columns), innovative condenser and serpentine micro-channel geometry, and selective refrigerant options "pumps" two-phase liquid back and forth at higher frequency to carry the latent heat very efficiently from the device hot spots to the condenser without pumps, wiring or controllers needed. This cooling technology can be scaled to benefit a wide range of applications, from the mobile industry (millions of mobile phones, tablets, laptops) to IoT, larger processors and data-center cabinets and aisles, automotive and aerospace applications, and beyond. For high power mobile microelectronics and PCs, the system works efficiently without forced convection.

Proposed innovation of PHP enhances the flow pulsation to increase the total cooling capacity by 50% or more compared to prior art. Adding the hemi-spherical (semi-spherical) or half cylindrical ribs will increase the wetted surface area per footprint area and decrease the heat flux on the wetted surface area, thus will increase the input heat fluxes that can be cooled; and is expected to contribute 15-20% cooling enhancement.

The heat transfer mechanism provides cooling the wetted surface area for elongated bubbles in the thin film evaporation (or condensation) through the liquid film. By increasing the wetted surface area per footprint area, we can decrease the liquid film thickness and increase the local heat transfer coefficients as per thermal conductivity/film thickness yields heat transfer coefficient; which can contribute a 30% cooling enhancement.

The dimples, bars, and columns, and other obstacles, will increase the heat transfer coefficient in the liquid slugs by disrupting and restarting the thermal boundary layer; contributes~20-30% cooling enhancement. The obstacles will create nucleation sites, or "corners", that are good as preferred nucleation sites; this might increase the heat transfer by approximately 15-20%.

Figure 2:
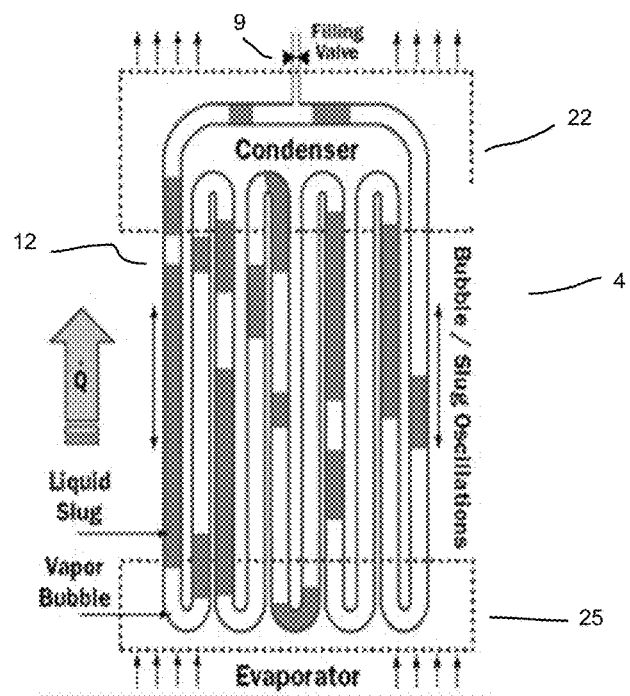
FIG. 2 illustrates a top cross-sectional plan view of a prior art PHP.
Figure 3:
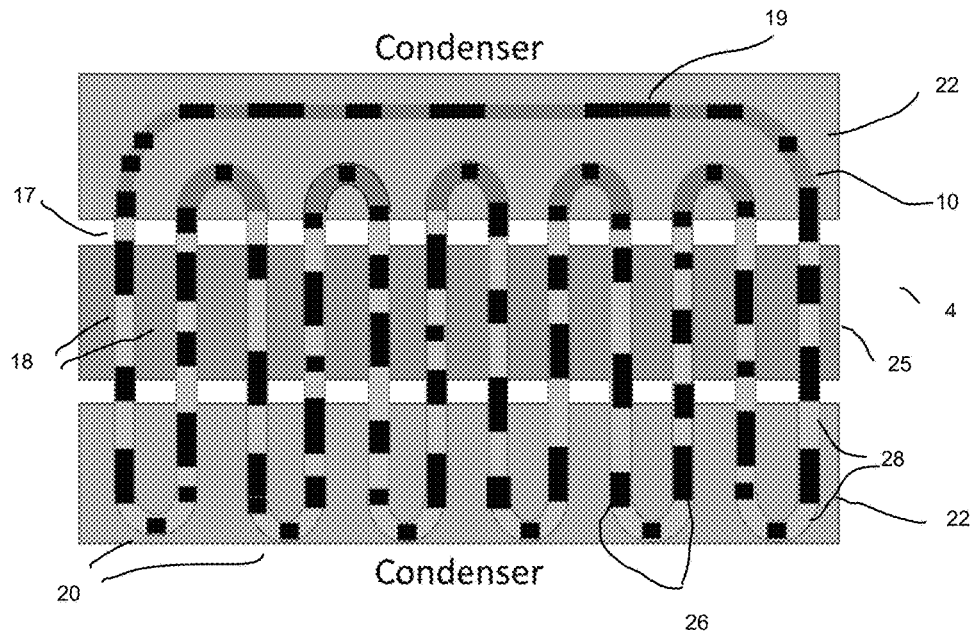
FIG. 3 illustrates a top cross-sectional plan view of a PHP of an embodiment of the present invention.
Figure 4:
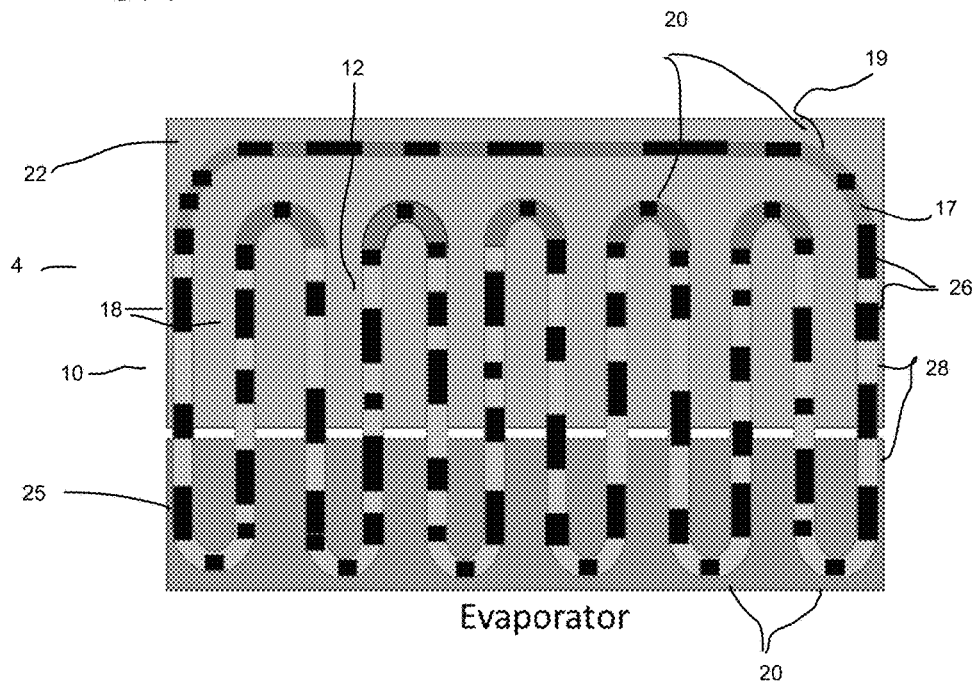
FIG. 4 illustrates a top cross-sectional view of a PHP of an embodiment of the present invention.

A cross-section of a standard portable electronic device 1 is shown in FIG. 1. Device 1 includes case 2 with electronic components 3. A pulsating heat pipe 4 (PHP) may be set against or near electronics 3, with a heat sink set near a condensing section (not shown), preferably opposite electronics. When viewed plan wise, as shown in FIG. 2, PHP 4 may have a filling valve or charging port 9. As shown generally in FIGS. 2-4, PHP 4 may include a closed loop 10 as is known in the art whereby working fluid is contained within loop 10. Channels 17 form serpentine pathway 12 through the PHP plate. Pathways 12 forms serpentine design with various bends 20 and straights 18 to increase total passage length in the single plane. Length of straights 18 may be maximized in channel 17 to facilitate the functionality of the present invention. Each end has bends 20, including radiation bar 19 at condenser 22. Heat source is placed near evaporator 25. Fluid forms liquid slugs 26 with vapor pockets 28 forming bubbles therebetween. Condenser 22 is set near heat sink 11, often out of plane, and potentially in parallel plane with channels 17. Heat enters PHP at evaporator 25 and is released out at condenser 22. Condenser 22 may be set at either side, or on one side, whereas evaporator 25 may be set in the middle or at one end, or as otherwise required by the particular electronic set up.

Figure 5:
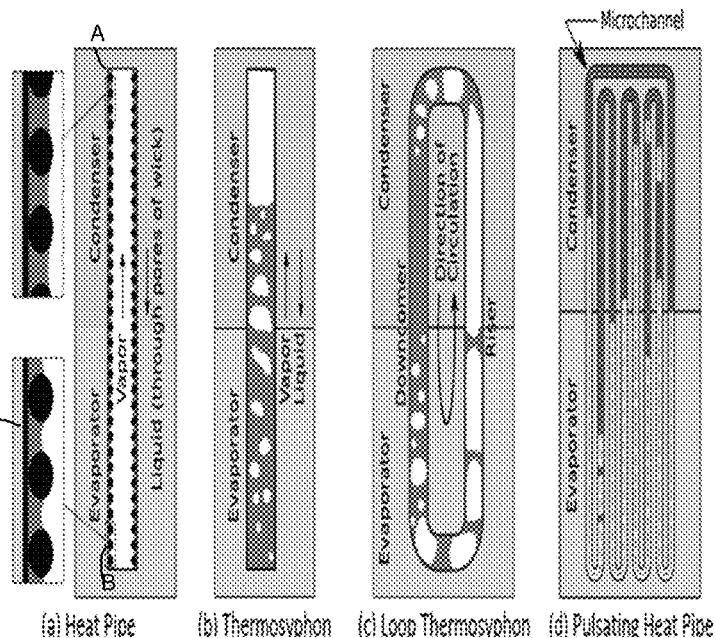
FIG. 5 illustrates four cross-sectional views of four prior art heat pipe types.
Figure 6:
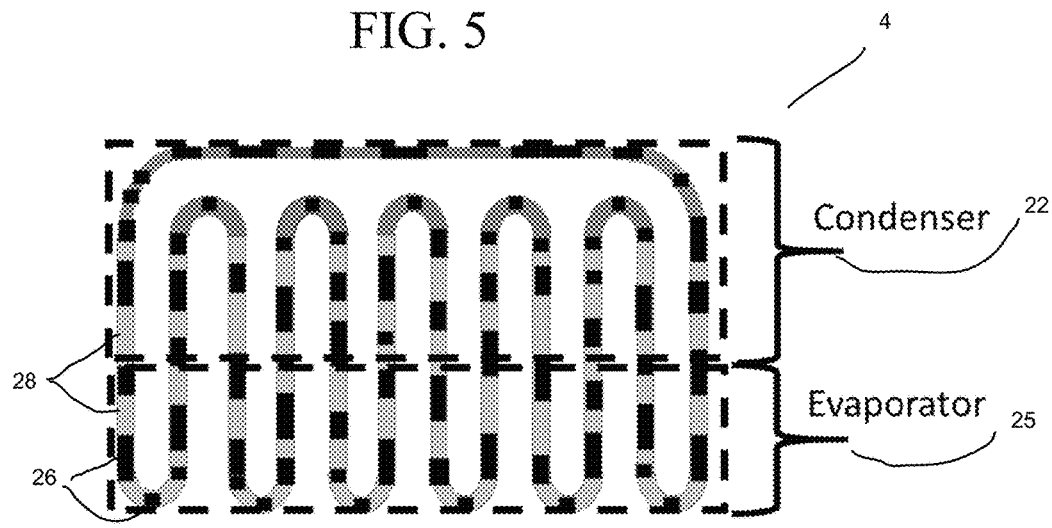
FIG. 6 illustrates a plan view of a serpentine pathway of an embodiment of the present invention.

To distinguish standard wicked heat pipes, as shown in FIGS. 5 and 5A and 5B, a channel 17 may include wick 29 as a feature or texture along the sidewall surfaces. Fluids 26 set within the wick and allow vapor 28 to pass through the center. Contrasting to PHPs, vapor packets are bound by liquid slugs. In contrast to prior art heat pipes, FIG. 6 introduces the pathway and condensation zones of a standard closed loop PHP in diagram, with condenser zone 22 set at one end with radiation bar 19, and evaporator zone opposite.

Figure 7:
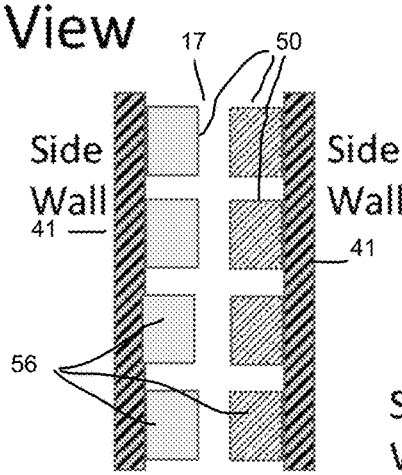
FIG. 7 illustrates a top cross-sectional view of a PHP channel of an embodiment of the present invention.

Focusing on the channels, it is helpful to view top, side and transverse cross-sectional views, as seen in FIGS. 7-99. While prior art PHP loops were rather smooth, the present invention introduces a concept of obstacles 50, distinct from wicking in prior art heat pipes. Obstacles allow for nucleation sites 55 along the outer surfaces 58 of obstacles 50 within the channel 17. It is contemplated that a working fluid liquid slug may pass over part of, or totally cover one or more obstacles 50 in channel 17. Obstacles are generally referenced as obstacles 50, but include a variety of shapes, as demonstrated as semisphericals 52, hemicylindrical features 56, columns 58, etc. The specific shape of the obstacles in practice may not readily conform to the geometrically described shapes. Herein, the term semispherical may refer to a semispherical object, spherical section, substantially round in shape, spikes, or dimples, generally, as a piece emanating from a wall. Hemicylindrical sections may refer to hemicylinders, portions of a cylinder, or a bar emanating from at least most of a wall, preferably spanning to opposing walls. Columns may be cylindrical, but refer to any shape that spans opposing walls without touching adjacent walls. Similar concepts refer to all obstacles described herein. Preferably, obstacles are limited to evaporator zone, but may also be included in adiabatic and/or condenser zones.

Figure 8:
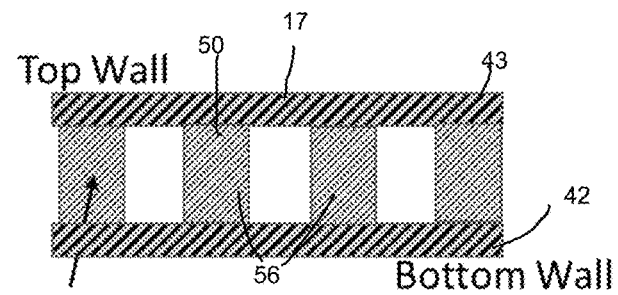
FIG. 8 illustrates a side cross-sectional view of a PHP channel of an embodiment of the present invention.
Figure 9:
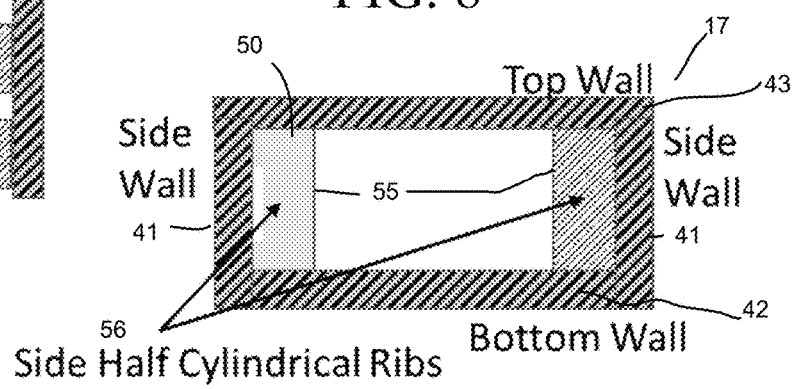
FIG. 9 illustrates a transversal cross-sectional view of a PHP channel of an embodiment of the present invention.
Figure 10:
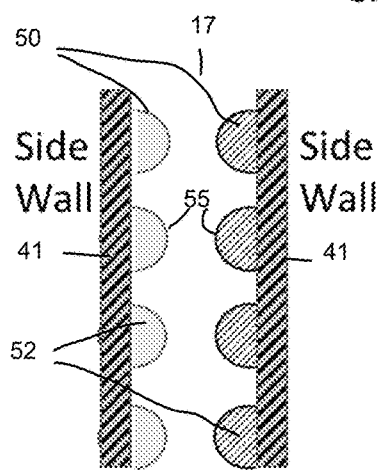
FIG. 10 illustrates a top cross-sectional view of a PHP channel of an embodiment of the present invention.
Figure 11:
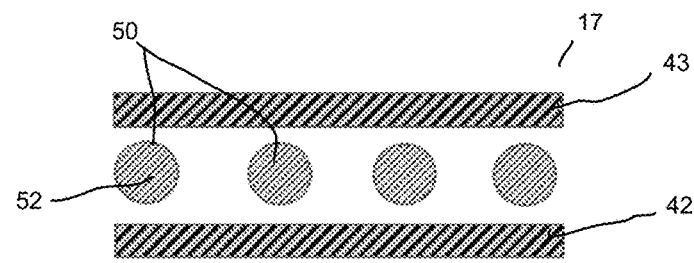
FIG. 11 illustrates a side cross-sectional view of a PHP channel of an embodiment of the present invention.
Figure 12:
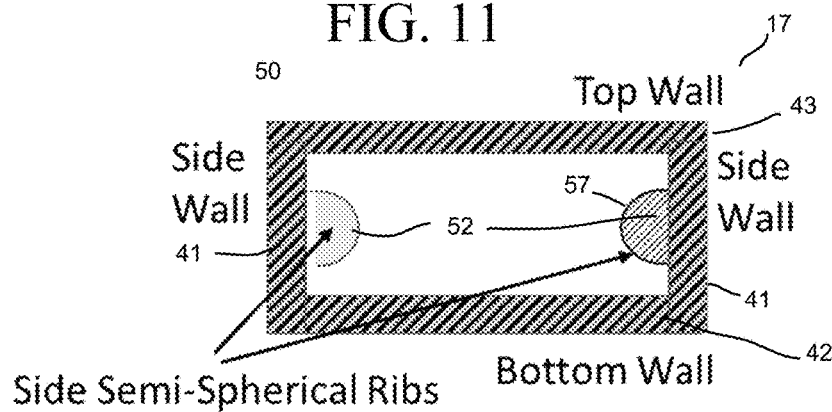
FIG. 12 illustrates a transversal cross-sectional view of a PHP channel of an embodiment of the present invention.
Figure 13:
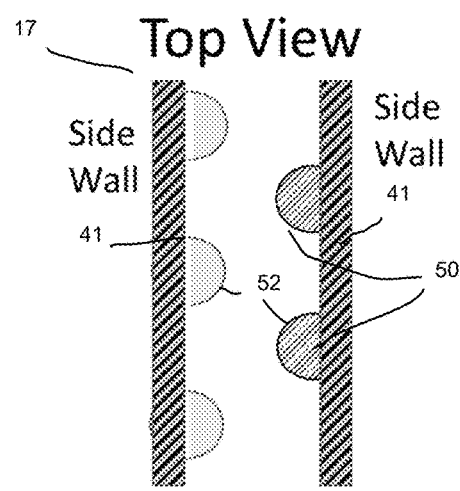
FIG. 13 illustrates a top cross-sectional view of a PHP channel of an embodiment of the present invention.
Figures 14, 16:
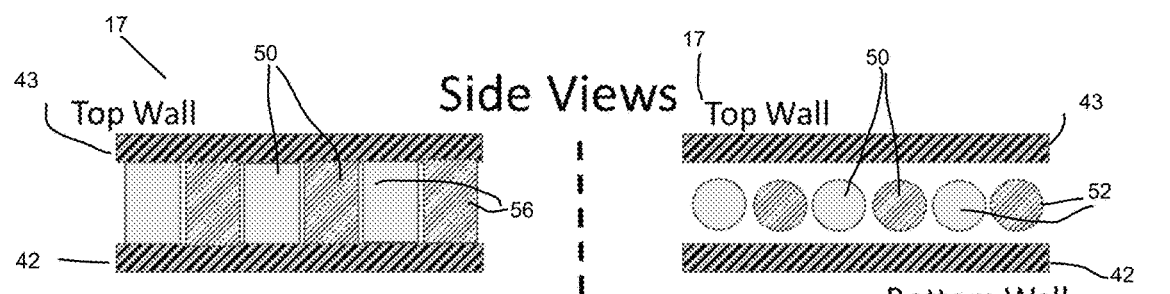
FIG. 14 illustrates a side cross-sectional view of a PHP channel of an embodiment of the present invention.
FIG. 16 illustrates a side cross-sectional view of a PHP channel of an embodiment of the present invention.
Figures 15, 17:
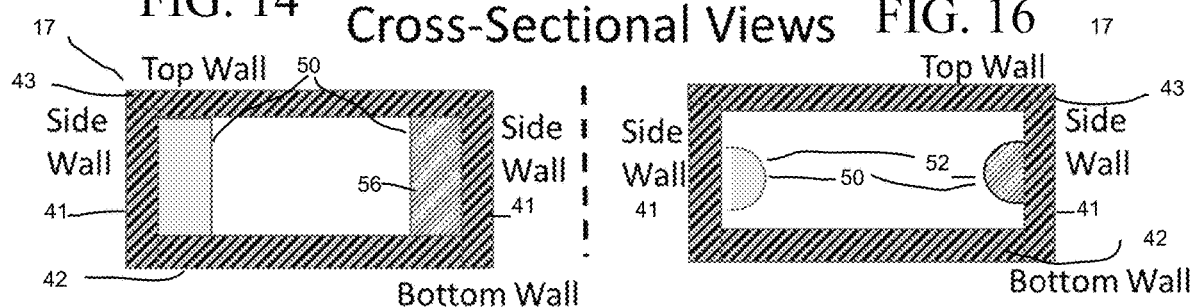
FIG. 15 illustrates a transversal cross-sectional view of a PHP channel of an embodiment of the present invention.
FIG. 17 illustrates a transversal cross-sectional view of a PHP channel of an embodiment of the present invention.
Figure 23:
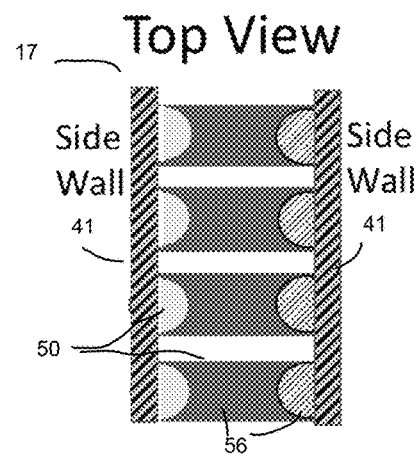
FIG. 23 illustrates a top cross-sectional view of a PHP channel of an embodiment of the present invention.
Figure 24:
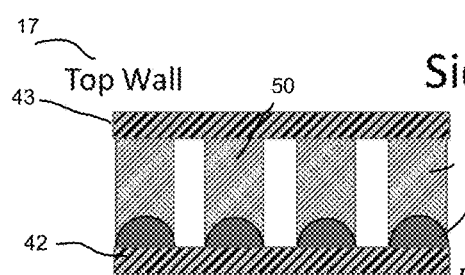
FIG. 24 illustrates a side cross-sectional view of a PHP channel of an embodiment of the present invention.
Figure 26:
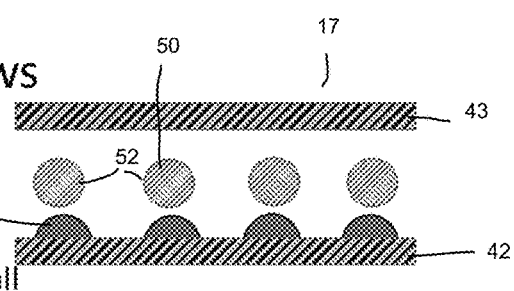
FIG. 26 illustrates a side cross-sectional view of a PHP channel of an embodiment of the present invention.
Figure 25:
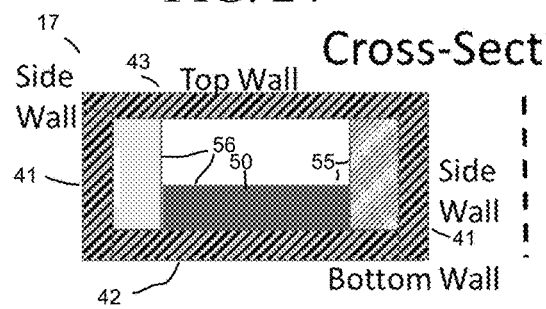
FIG. 25 illustrates a transversal cross-sectional view of a PHP channel of an embodiment of the present invention.
Figure 27:
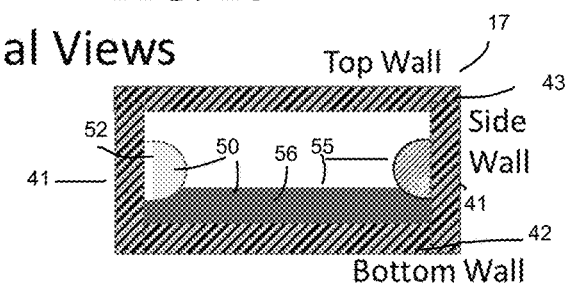
FIG. 27 illustrates a transversal cross-sectional view of a PHP channel of an embodiment of the present invention.
Figures 48, 50:
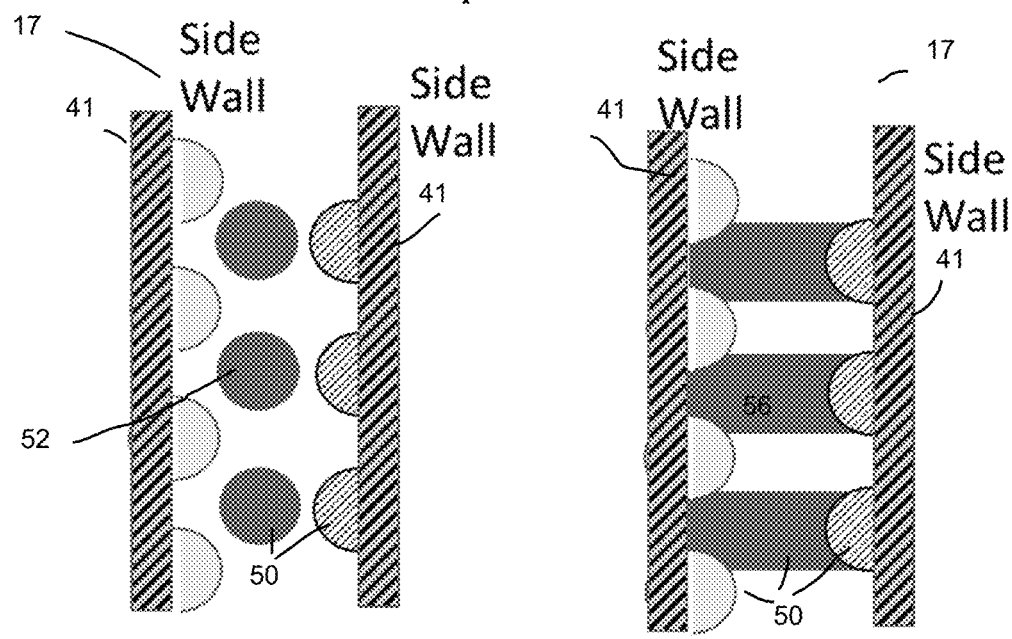
FIG. 48 illustrates a top cross-sectional view of a PHP channel of an embodiment of the present invention.
FIG. 50 illustrates a top cross-sectional view of a PHP channel of an embodiment of the present invention.
Figures 49, 51:
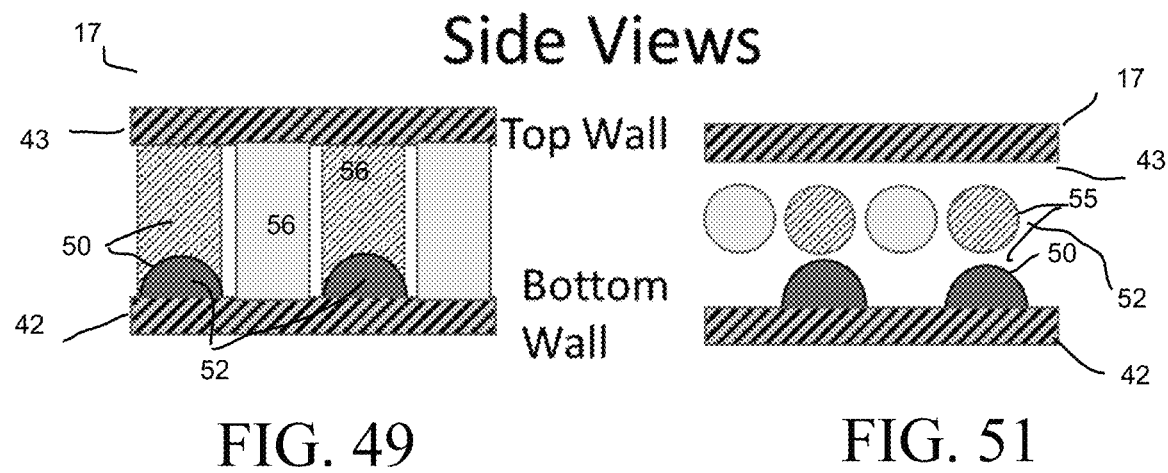
FIG. 49 illustrates a side cross-sectional view of a PHP channel of an embodiment of the present invention.
FIG. 51 illustrates a side cross-sectional view of a PHP channel of an embodiment of the present invention.
Figures 52, 54:
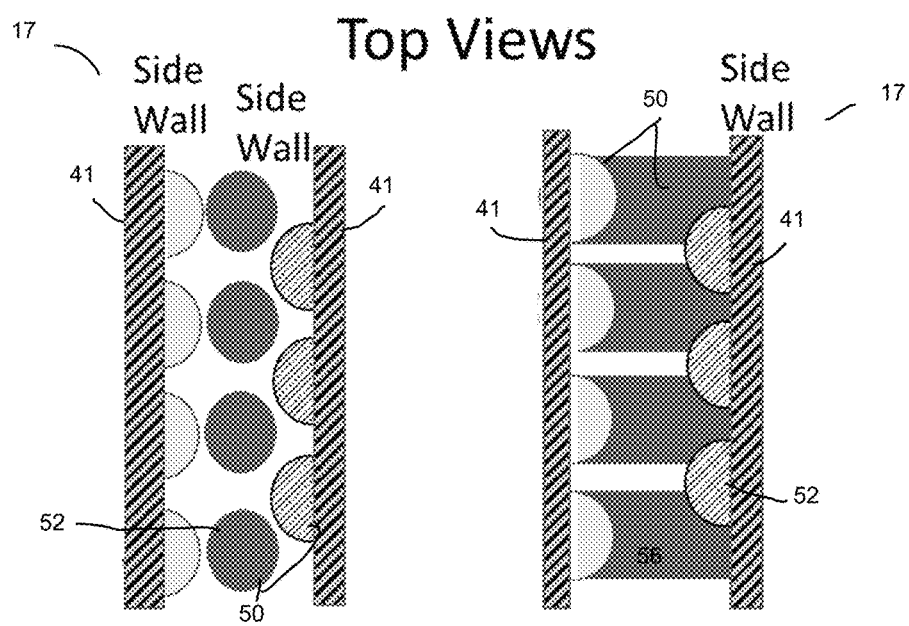
FIG. 52 illustrates a top cross-sectional view of a PHP channel of an embodiment of the present invention.
FIG. 54 illustrates a top cross-sectional view of a PHP channel of an embodiment of the present invention.
Figures 53, 55:
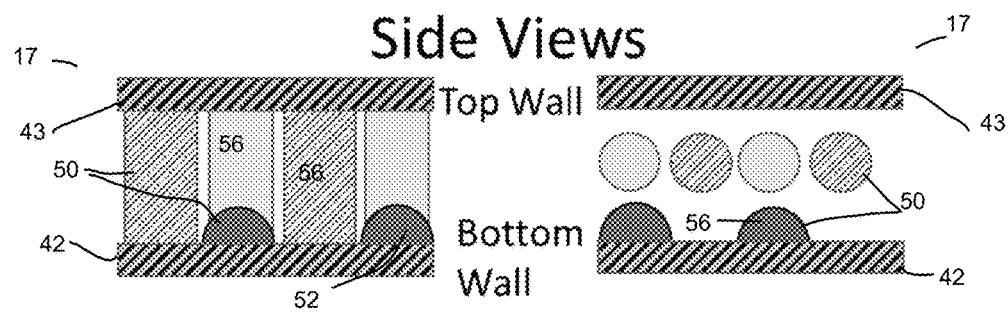
FIG. 53 illustrates a side cross-sectional view of a PHP channel of an embodiment of the present invention.
FIG. 55 illustrates a side cross-sectional view of a PHP channel of an embodiment of the present invention.

Channel 17 includes side walls 41, bottom wall 42 and top wall 43. Due to technological limitations today, a top wall is preferably emplaced over the bottom and sidewalls during construction of the PHP. As shown in a first embodiment, FIGS. 7-9 demonstrate hemicylindrical 56 occlusions as obstacles 50 in channel. Here, hemicylinders 56 are affixed to side walls 41. Hemicylinders may be affixed to one or both side walls and may extend on side walks) from bottom to top wall or a large portion thereof. Hemicylinders may be set opposite one another or offset. Regular patterns may be employed, or the obstacles may be randomly incorporated. As shown in FIG. 10-12, semispherical obstacles 52 may function to produce nucleation sites 55 on the exterior surface 57 of the obstacles 50 and may be set along the side walls. Preferably, semispherical 52 are set at mid wall between top and bottom, but a quarter-sphere may be set along the intersection of bottom and side, and/or top and side wall.

Demonstrating an offset pattern, obstacles 50 may be set on side walls in an offset pattern, as shown in FIGS. 13-17. Obstacles may be staggered or offset, and may be of either semispherical 52 and or hemicylindrical 56 on side walls 41.

In some embodiments, obstacles 50 form on both side walls 41 and bottom wall 42. Shown in FIGS. 18-22, bottom wall 42 may include semispherical 52, while side walls may include semispherical 52 and/or hemicylindrical bodies 56. In alternative embodiments shown in FIGS. 23-27, a hemicylindrical body 56 may traverse the channel 17 to bind to both side walls 41. Side walls may also feature semispherical 52 and/or hemicylindrical objects 56. As shown in FIGS. 33-37, it may be preferable to stagger lower hemicylindrical 56 on bottom wall 42 from side wall 41 features. As shown in FIGS. 28-32, the objects may be staggered.

Further configurations include a matchup of semispherical 56 and hemicylindrical obstacles. For instance, as shown in FIGS. 38-42, hemicylindrical sections may be emplaced on all four, sidewalls 41, bottom wall 42 and top wall 43. When arranged in unison as shown in FIGS. 38-39, they severely restrict channel 17. When arranged in staggered or offset pattern, as shown in FIGS. 41-42, they require the fluid to traverse in a fashion requiring alternating lateral restriction (when sidewall obstructed) with vertical restrictions (when bottom and/or top are restricted. When utilizing hemicylindrical bars joining top and bottom walls 43 and 42 along side walls 41, as shown in FIGS. 43-47, semispherical 52 may be emplaced on top and bottom walls 43 and 42. The obstacles may be aligned, as shown in FIGS. 43-44, or offset in staggered array as shown in FIGS. 46-47.

Obstacles may be emplaced on three of the four walls of the channels, as shown in FIGS. 48-55, with hemicylindrical bars 56 set along walls that may or may not extend the entire length of the wall, and semispherical 52. All four walls may include semispherical 52 or other like features extending from each wall as shown in FIGS. 56-60, either aligned or staggered. Bars as hemicylinders 56 may join side walls 41 as shown in FIGS. 61-65, with semispherical 52 set on other walls in either aligned or staggered pattern, as shown in FIGS. 61-65.

Figure 66:
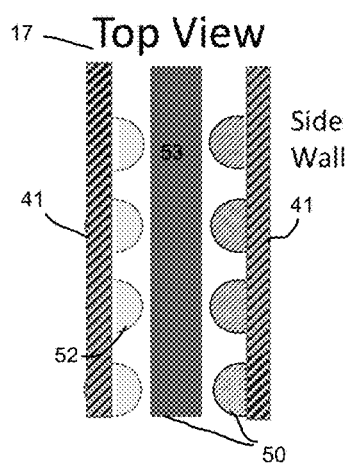
FIG. 66 illustrates a top cross-sectional view of a PHP channel of an embodiment of the present invention.
Figure 67:
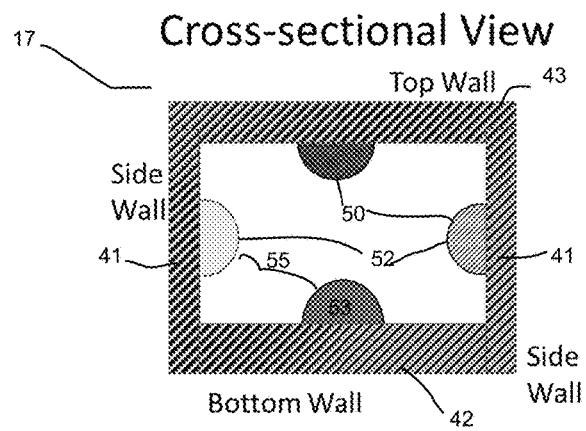
FIG. 67 illustrates a transversal cross-sectional view of a PHP channel of an embodiment of the present invention.
Figure 68:
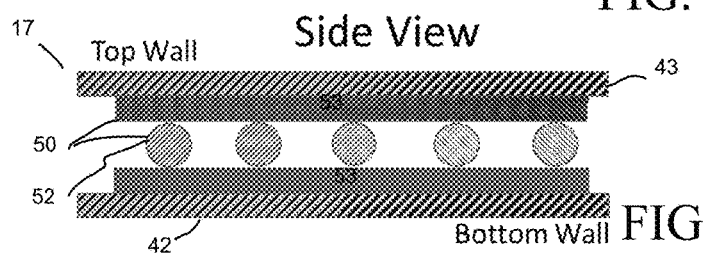
FIG. 68 illustrates a side cross-sectional view of a PHP channel of an embodiment of the present invention.

When channel 17 is beset with longitudinal bar 53, as shown in FIGS. 66-68, nucleation may run along the length of the channel. Semisphericals 52 may be optionally added to one, two, or three sidewalls, or as shown, longitudinal bars may run the bottom and top walls 42 and 43, while the side walls 41 have extended features. Alternatively, the sidewalls may have bars while the top and bottom may optionally have semisphericals or none.

Figure 69:
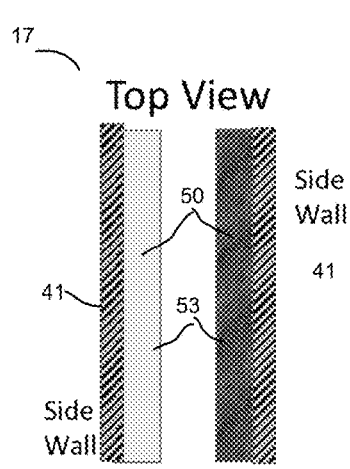
FIG. 69 illustrates a top cross-sectional view of a PHP channel of an embodiment of the present invention.
Figure 70:
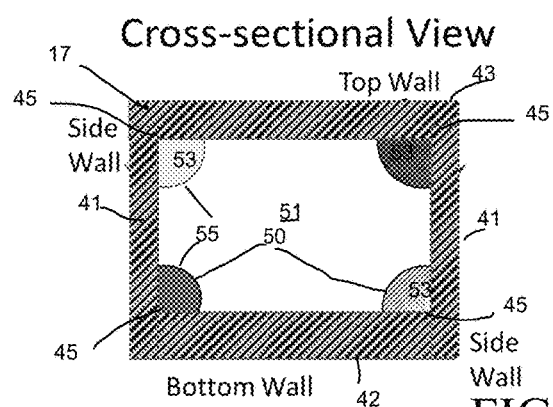
FIG. 70 illustrates a transversal cross-sectional view of a PHP channel of an embodiment of the present invention.
Figure 71:
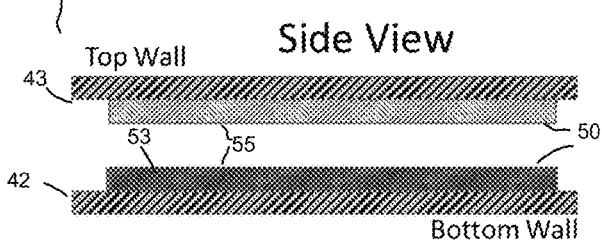
FIG. 71 illustrates a side cross-sectional view of a PHP channel of an embodiment of the present invention.
Figure 78:
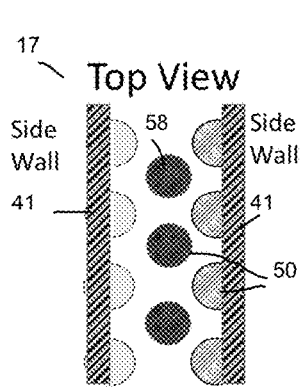
FIG. 78 illustrates a top cross-sectional view of a PHP channel of an embodiment of the present invention.
Figure 79:
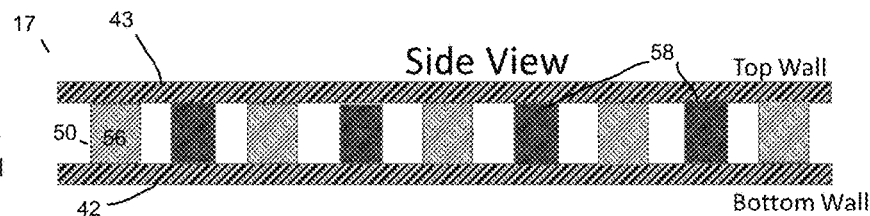
FIG. 79 illustrates a side cross-sectional view of a PHP channel of an embodiment of the present invention.
Figure 80:
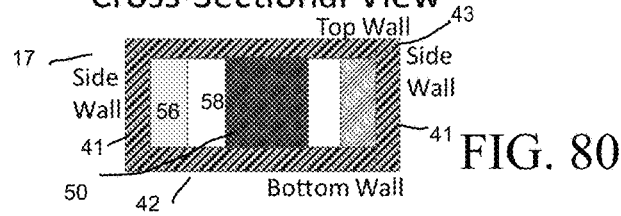
FIG. 80 illustrates a transversal cross-sectional view of a PHP channel of an embodiment of the present invention.
Figure 81:
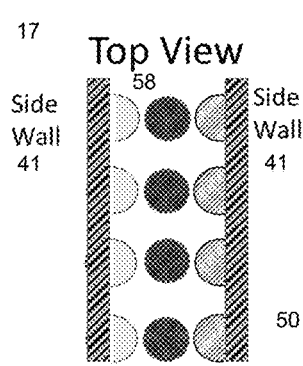
FIG. 81 illustrates a top cross-sectional view of a PHP channel of an embodiment of the present invention.
Figure 82:
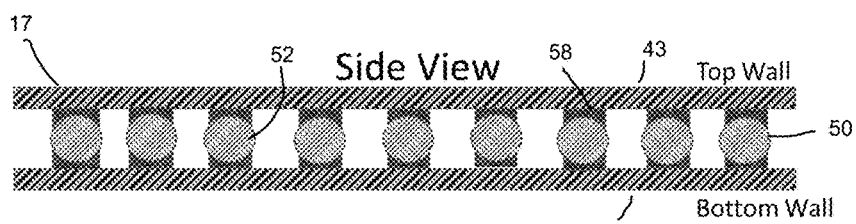
FIG. 82 illustrates a side cross-sectional view of a PHP channel of an embodiment of the present invention.
Figure 83:
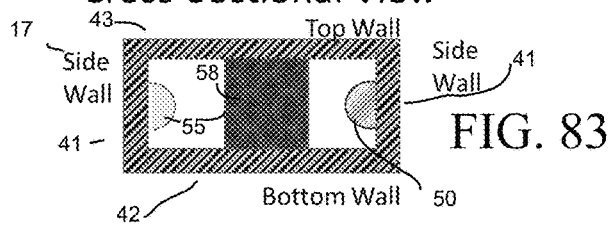
FIG. 83 illustrates a transversal cross-sectional view of a PHP channel of an embodiment of the present invention.
Figure 84:
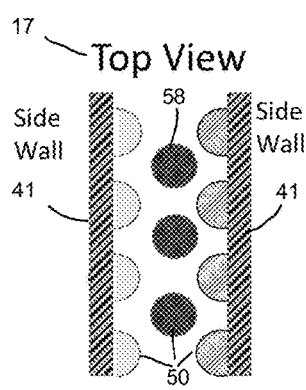
FIG. 84 illustrates a top cross-sectional view of a PHP channel of an embodiment of the present invention.
Figure 85:
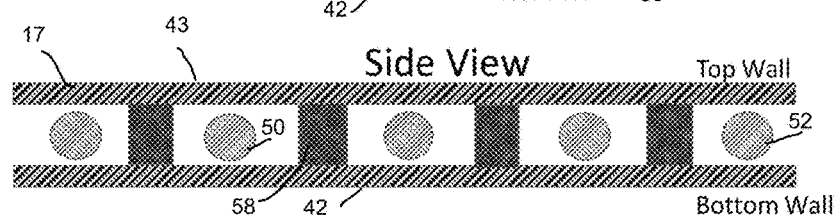
FIG. 85 illustrates a side cross-sectional view of a PHP channel of an embodiment of the present invention.
Figure 86:
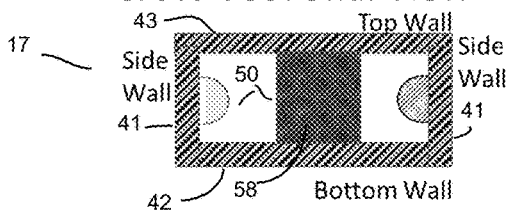
FIG. 86 illustrates a transversal cross-sectional view of a PHP channel of an embodiment of the present invention.

As shown in FIGS. 69-71, corners 45 of channel 17 may include obstacle features, such as longitudinal bars 53. Longitudinal bars 53 may extend the length of a straight, be set only within the evaporator zone, or may be short members more akin to quarterspherical or spikes extending into center 51 of channel along corners 45 of channel 17.

In instances where free-standing columns 58 are required, as shown in FIGS. 72-74, a full cylinder may extend from side wall to sidewall, or from top to bottom 43 to 42, as shown. Columns 58 may be cylinders or rectangular, or otherwise a feature with a continual diameter or width from top to bottom, as is feasibly possible.

Figure 87:
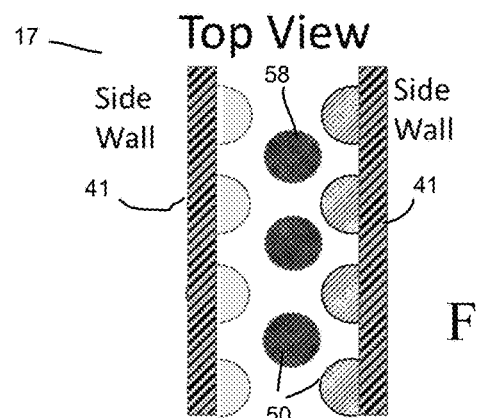
FIG. 87 illustrates a top cross-sectional view of a PHP channel of an embodiment of the present invention.
Figure 88:
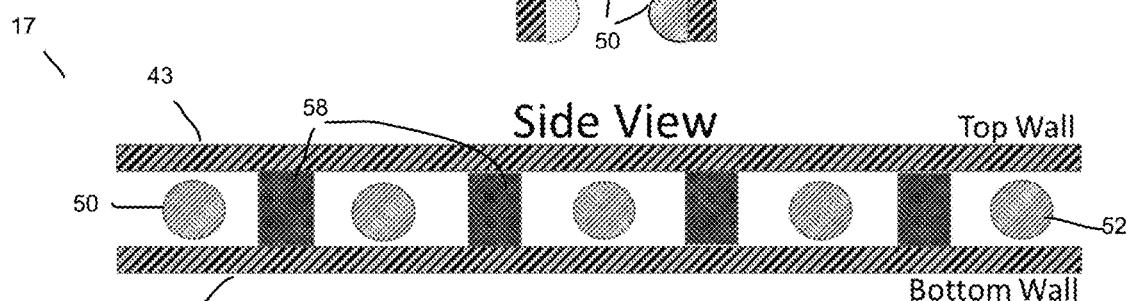
FIG. 88 illustrates a side cross-sectional view of a PHP channel of an embodiment of the present invention.
Figure 89:
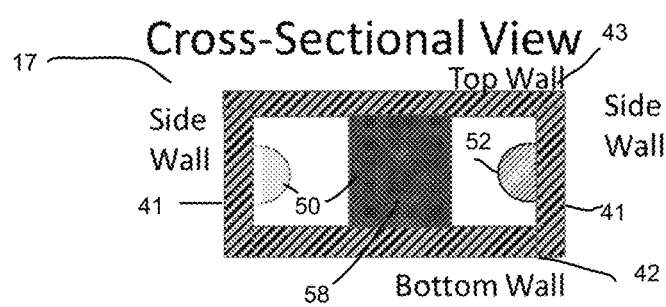
FIG. 89 illustrates a transversal cross-sectional view of a PHP channel of an embodiment of the present invention.

Referring to FIGS. 75-86, columns 58 may be used to join top and bottom walls 43 and 42. Additional features, including semisphericals 52 and hemicylinders 56 may be used in conjunction, either aligned or staggered on side walls 41 or otherwise as shown. Demonstrated with FIGS. 87-89, when referencing semisphericals 52 and hemicylinders 56, or columns 58, the exact geometric shape is not necessarily required, but inspiration therefor. At these small scales, the approximation of these features is all that may be required, and the exact shape is discussed and demonstrated in the figures to convey the idea. Any protrusion along the walls is discussed as a semispherical, while any feature, whether consistent in diameter or not that extends between opposing walls is referred as a cylinder or hemicylinder. In addition, it is contemplated that a feature extending between two opposing walls may not actually contact one or both of the walls, but seen as an approximate of shapes useful to induce nucleation sites 55 along outer surfaces 57.

Further PHP channels are shown in FIGS. 90-99, wherein a central riser or longitudinal hump 59, of a shape similar to a hemicylindrical hump 59 on the bottom wall 42 within channel 18 is shown. Hump 59 may be employed on any of the walls. Offset semisphericals 52 may be employed as shown in FIG. 91, or the sidewall 41 features may be aligned (more akin to those side wall features shown in FIG. 92. Longitudinal humps 59 may be employed on opposite surfaces, as shown in FIGS. 92-94, for example on bottom wall 42 and top wall 43. Side wall features may be aligned, as shown in FIGS. 92-94, or more preferably staggered. As shown in FIGS. 95-99, a single hump may be set with features such as hemicylindrical 56 that reach between two opposing sides, an adjacent side and an opposite side as shown in FIGS. 96-97, or with semispherical features on adjacent (and potentially opposite) sides as shown in FIGS. 98-99.

Figure 100:
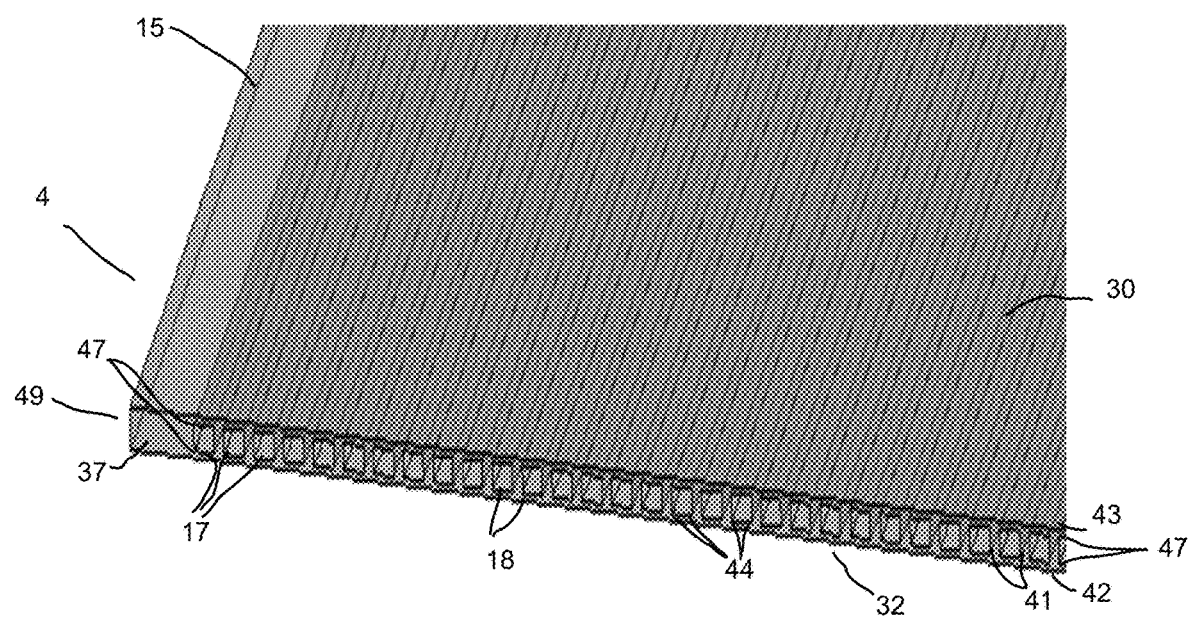
FIG. 100 illustrates a perspective transversal cross-sectional view of PHP channels in a plate of an embodiment of the present invention.
Figure 101:
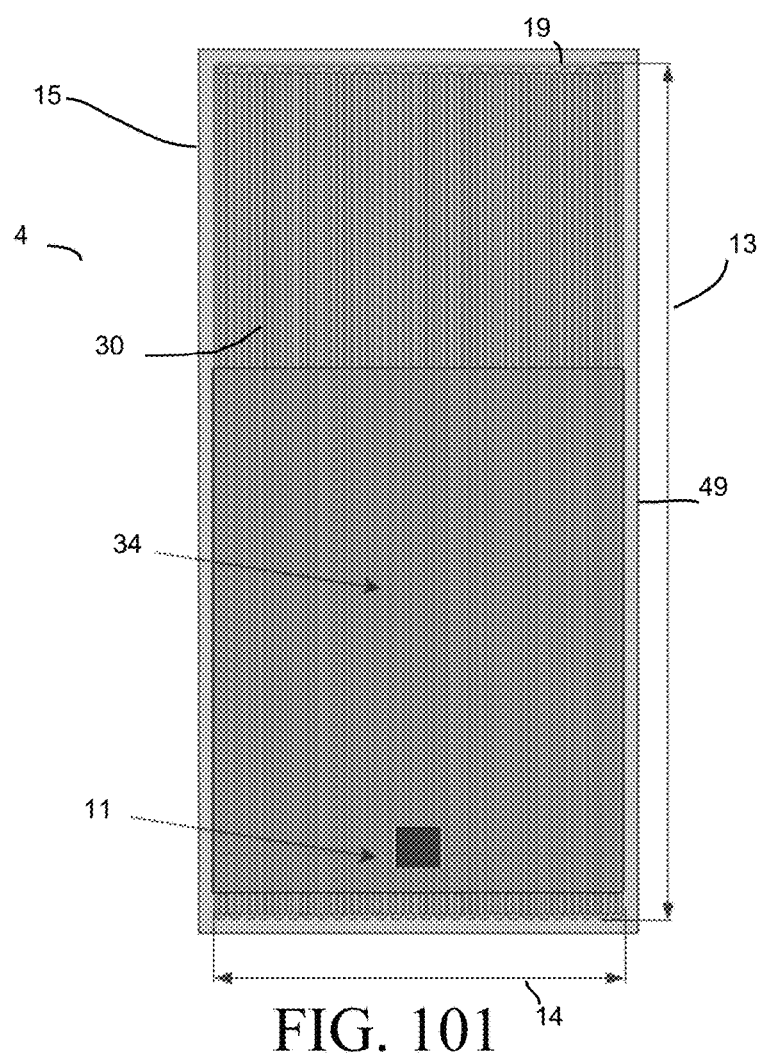
FIG. 101 illustrates a top transparent view of a PHP plate of an embodiment of the present invention.

Referring now to the general shape, contours, and composition of the PHP, plate 15 is shown in cross-sectional perspective at FIG. 100. Channels 17 form serpentine 16 through plate 15, with sidewalls 41 exposed, and bottom wall 42 and top walls 43 shown. Sidewall thickness may form a uniform span width between channels. Plate 15 includes top surface 30 and bottom surface 32. Preferably, channels 17 are regularly arrayed through structure to form serpentine 16 with pathways 12 aligned parallel one another at straights 18. Each channel 17 includes a channel width 44 (between sidewalls within channels) and channel height 47 (between top wall and bottom wall within channels), preferably uniform as is approximated with manufacturing techniques. External wall thickness 46 of top wall 43 and bottom 42 may or not be similar to one another. Each channel 17 includes a height 49 that may or may not be reduced by obstacles (not shown). As seen in FIGS. 100-101, PHP 4 includes planar plate 15 that may be rigid or flexible. Heat source 11 may take the form of an electronic component placed along, adjacent or in contact with plate surfaces 30 and/or 32. The PHP has a total width 14 and length 13.

Figure 102:
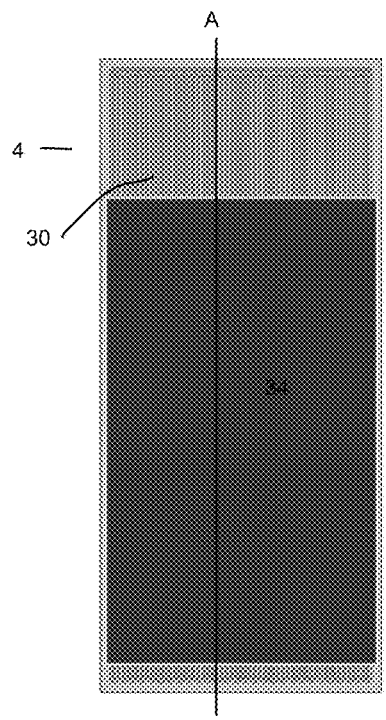
FIG. 102 illustrates a top view of a PHP plate of an embodiment of the present invention.
Figure 103:
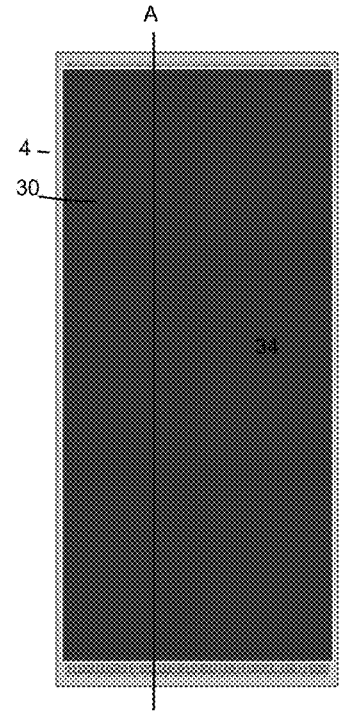
FIG. 103 illustrates a top view of a PHP plate of an embodiment of the present invention.
Figure 104:
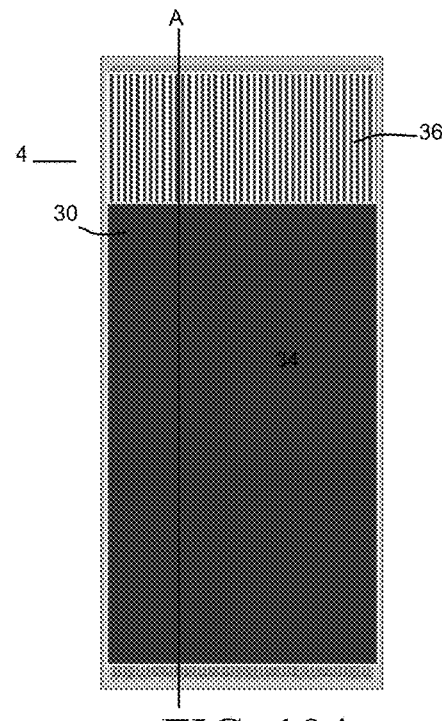
FIG. 104 illustrates a top view of a PHP plate of an embodiment of the present invention.
Figure 102A:
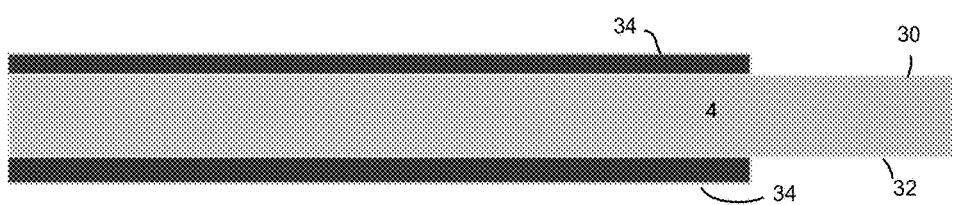
FIG. 102A illustrates a cross-sectional view of the PHP plate of FIG. 92.
Figure 103A:
FIG. 103A illustrates a cross-sectional view of the PHP plate of FIG. 92.
Figure 104A:
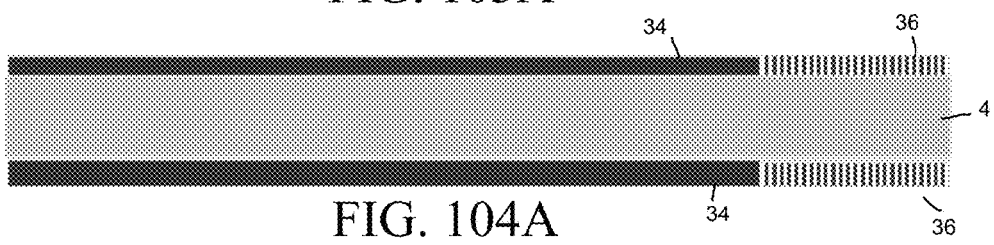
FIG. 104A illustrates a cross-sectional view of the PHP plate of FIG. 92.

Various deployments of a thin conductive sheeting, such as copper plating 34, serve as both heat sink and physical reinforcement to PHP to prevent unnecessary bending of plate and potential cracking or distortion that may cause interference with PHP function. Plating (or foil) may be 10-500 microns thick, more preferably 20-150 microns, and most preferably 20-25 microns. As shown in FIGS. 102-104, plating 34 may be set over top surface 30 of plate 15 in a partially smooth layer over the condenser section, as shown in FIG. 102, over the entire width as shown in FIG. 103, over the entirety of both sides (not shown).

Figure 105:
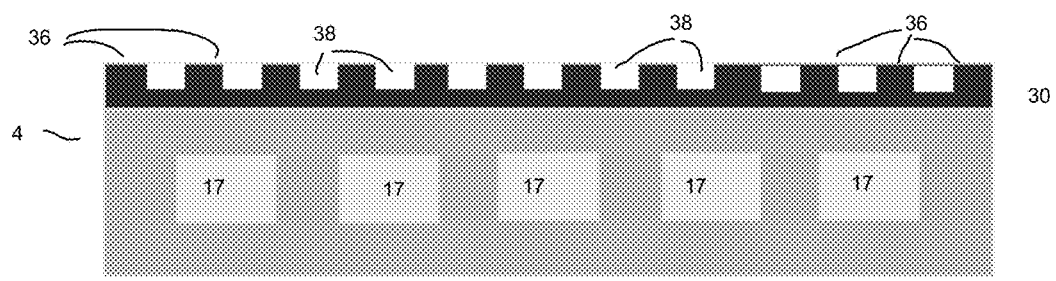
FIG. 105 illustrates a transversal cross-sectional view of the PHP plate of an embodiment of the present invention.

Alternatively, a portion of the top surface 30 maybe fitted with outer-ribs as a spreader unit to distribute the heat at condenser. Outer ribs 36 may run parallel with straights 18, while a smooth plating 34 may be set over the remainder of surface 30. It is contemplated that a preferred embodiment shows the micro-ribs 36 and plating over both top and bottom surfaces of plate in a similar fashion with the condenser set by micro ribs on both sides. As shown in cross-section FIG. 105, ribs 36 may be employed with valleys 38 set between each, and the ribbing may be more numerous that the channels 17 in plate 15, with a minimum base 37 set direction on top surface 30. It is contemplated that the number of ribs may be equivalent in number to the channel, or positioned above each channel. The width of each rib may be sized according to the channel widths and/or the sidewall widths. Outer ribs and valleys may be of equivalent width, but preferably, the valleys are wider than the outer ribs. Outer ribs provide additional surface area for the dissipation of heat from condenser to heat sink. For example, with a plating thickness of 20-25 microns, the outer ribs may have a pitch (defined as distance between micro-channels) that is less than the distance between channels. Alternatively, the outer ribs may be aligned with interior channel pitch, or greater. When PHP is set vertically, or to align outer ribs vertically, plumes of air may form and move through valleys to enhance heat dissipation.

Figures 106, 107, 108, 109:
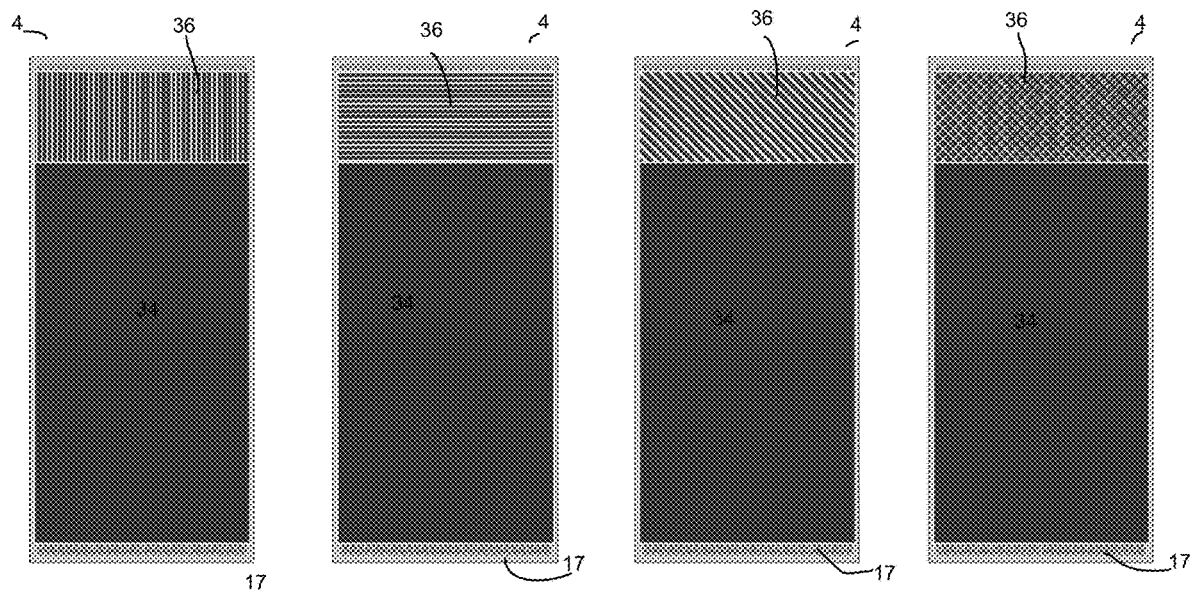
FIG. 106 illustrates a top view of a PHP plate of an embodiment of the present invention.
FIG. 107 illustrates a top view of a PHP plate of an embodiment of the present invention.
FIG. 108 illustrates a top view of a PHP plate of an embodiment of the present invention.
FIG. 109 illustrates a top view of a PHP plate of an embodiment of the present invention.

Alternative arrangements of ribs are shown in FIGS. 106-109. Plating 34 remains over plate 15 top surface 30 (and preferably also bottom surface (not shown). Ribs may be aligned along serpentine straights as shown in FIG. 106, traverse same as shown in FIG. 107, in diagonal (such as at forty-five degrees) as shown in FIG. 108, or crisscross in checkered array with excess valleys at intersections as shown in FIG. 109.

Figures 110, 111, 112, 113:
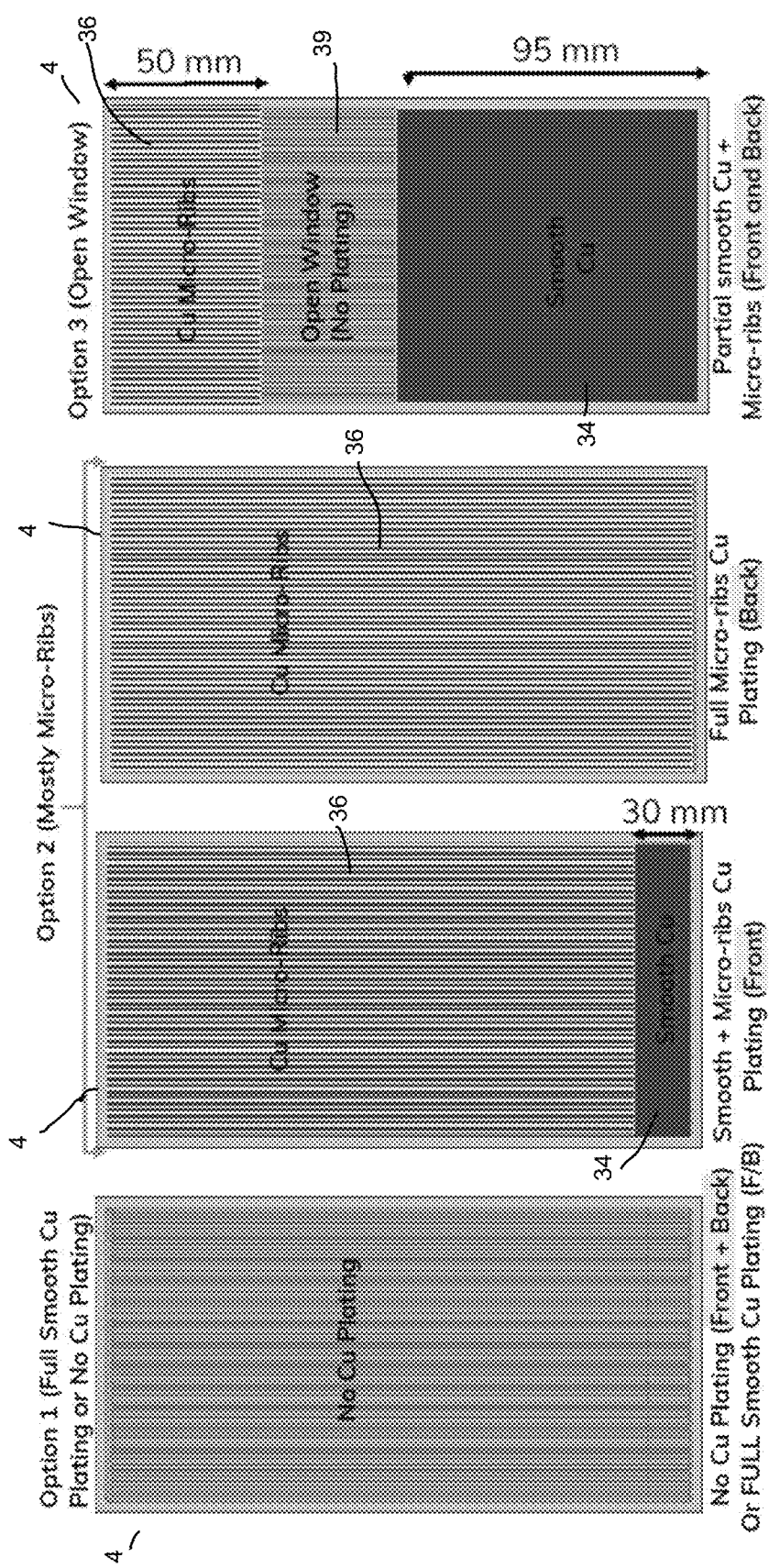
FIG. 110 illustrates a top view of a PHP plate of an embodiment of the present invention.
FIG. 111 illustrates a top view of a PHP plate of an embodiment of the present invention.
FIG. 112 illustrates a top view of a PHP plate of an embodiment of the present invention.
FIG. 113 illustrates a top view of a PHP plate of an embodiment of the present invention.

Alternative positioning of plating and ribs is shown in FIGS. 110-113. Both top and bottom surfaces may be uncovered or plated in the entirely, as shown in FIG. 110. A top and bottom of plate 15 is shown in FIGS. 111-112, with smooth plating 34 set on surface 30 of plate 15 at condenser zone, with ribs 36 over the remainder, while the bottom surface 32 of plate 15 comprises all ribbing 36. An open window embodiment, such as that shown in FIG. 113 may be employed with the smooth plate 34 on surface at evaporator, and ribs 36 at condenser zone, and an open window 39 set therebetween.

We claim:

1. A two-phase micro-channel embedded closed loop pulsating heat pipe comprising:
    a first sheet having a serpentine trace pattern comprising a trace pattern;
    a second sheet bonded onto said first sheet, such that when said first sheet and said second sheet are bonded together to form a bonded plate, the bonded plate defining a contiguous serpentine micro-channel in said bonded plate, said channel comprising a generally rectangular cross-sectional shape, a bottom wall, a top wall opposing said bottom wall, and two opposing side walls;
    wherein said serpentine micro-channel defines a closed loop adapted to contain fluid within said serpentine micro-channel; and
    a working fluid partially filling said channel in liquid and or vapor form;
    wherein said micro-channel comprises one or more obstacles, at least one of said obstacles selected from the group essentially consisting of:
    a hemicylindrical obstruction spanning two opposing walls of said bottom wall, a top wall, and two opposing side walls,
    a semispherical obstacle set on at least one of said top wall and said bottom wall, and/or
    a hemicylindrical obstacle set on at least one of said top wall and said bottom wall, said hemicylindrical obstacle spanning between said side walls;
    said one or more obstacles mounted on at least one of said top wall, bottom wall, and/or side walls;
    wherein said plate comprises a first region defining a condenser region coupled to a heat sink and a second region comprising an evaporator region coupled or near at least one heat source.

2. The two-phase micro-channel embedded closed loop pulsating heat pipe of claim 1 wherein said one or more obstacles comprises a hemicylindrical obstruction spanning two opposing walls of said bottom wall, a top wall, and two opposing side walls.

3. The two-phase micro-channel embedded closed loop pulsating heat pipe of claim 1 wherein said one or more obstacles comprises a semispherical obstacle set on at least one of said top wall and said bottom wall.

4. The two-phase micro-channel embedded closed loop pulsating heat pipe of claim 3 wherein said semispherical obstacle is set on said bottom wall and in line with at least one obstacle set along at least one of said side walls.

5. The two-phase micro-channel embedded closed loop pulsating heat pipe of claim 3 wherein said semispherical obstacle is set on said bottom wall and staggered relative with at least one obstacle set along at least one of said side walls.

6. The two-phase micro-channel embedded closed loop pulsating heat pipe of claim 3 wherein said semispherical obstacle is set on said top wall and in line with at least one obstacle set along at least one of said side walls.

7. The two-phase micro-channel embedded closed loop pulsating heat pipe of claim 3 wherein said semispherical obstacle is set on said top wall and staggered relative with at least one obstacle set along at least one of said side walls.

8. The two-phase micro-channel embedded closed loop pulsating heat pipe of claim 1 wherein said one or more obstacles comprises a hemicylindrical obstacle set on at least one of said top wall and said bottom wall, said hemicylindrical obstacle spanning between said side walls.

9. The two-phase micro-channel embedded closed loop pulsating heat pipe of claim 8 wherein said hemicylindrical obstacle is set on said bottom wall and in line with at least one obstacle set along at least one of said side walls.

10. The two-phase micro-channel embedded closed loop pulsating heat pipe of claim 8 wherein said hemicylindrical obstacle is set on said bottom wall and staggered relative with at least one obstacle set along at least one of said side walls.

11. The two-phase micro-channel embedded closed loop pulsating heat pipe of claim 8 wherein said hemicylindrical obstacle is set on said top wall and in line with at least one obstacle set along at least one of said side walls.

12. The two-phase micro-channel embedded closed loop pulsating heat pipe of claim 8 wherein said hemicylindrical obstacle is set on said top wall and staggered relative with at least one obstacle set along at least one of said side walls.

13. A two-phase micro-channel embedded closed loop pulsating heat pipe comprising:
- a plate with a channel set within, the channel comprising a working fluid, a generally rectangular cross-section, with a top surface and a bottom surface, and at least one obstacle set within the channel and upon either the top, lateral sides, or bottom surface, modifying said generally rectangular cross-section;
- said at least one obstacle comprising a hemicylindrical shape or semispherical shape; and
- said channel forming a plurality of bends.

* * * * *